United States Patent
Watanabe

(10) Patent No.: US 8,274,154 B2
(45) Date of Patent: Sep. 25, 2012

(54) SEMICONDUCTOR DEVICE WITH INTERFACE PEELING PREVENTING REWIRING LAYER

(75) Inventor: Kiyonori Watanabe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/926,662

(22) Filed: Dec. 2, 2010

(65) Prior Publication Data

US 2011/0074032 A1 Mar. 31, 2011

Related U.S. Application Data

(62) Division of application No. 11/798,991, filed on May 18, 2007, now Pat. No. 7,847,407.

(30) Foreign Application Priority Data

Jul. 13, 2006 (JP) .................................. 2006-192881

(51) Int. Cl.
  *H01L 21/44* (2006.01)
(52) U.S. Cl. ........ 257/773; 257/758; 257/737; 257/751; 257/E23.141
(58) Field of Classification Search .................. 257/773, 257/758, 737, 751
See application file for complete search history.

(56) References Cited

U.S. PATENT DOCUMENTS

| | | | |
|---|---|---|---|
| 5,268,072 A | 12/1993 | Agarwala et al. | |
| 5,376,584 A | 12/1994 | Agarwala | |
| 6,455,408 B1 | 9/2002 | Hwang et al. | |
| 6,749,760 B2 | 6/2004 | Danielson et al. | |
| 6,930,389 B2 | 8/2005 | Huang | |
| 7,221,054 B2 | 5/2007 | Minda | |
| 7,244,671 B2 | 7/2007 | Mis et al. | |
| 7,253,519 B2 | 8/2007 | Huang et al. | |
| 7,271,498 B2 | 9/2007 | Huang | |
| 7,445,958 B2 * | 11/2008 | Suminoe et al. | ............. 438/107 |
| 7,462,535 B2 | 12/2008 | Lee et al. | |
| 7,470,997 B2 | 12/2008 | Lin et al. | |
| 2002/0014705 A1 * | 2/2002 | Ishio et al. | .................... 257/784 |
| 2005/0017355 A1 | 1/2005 | Chou et al. | |
| 2005/0258540 A1 | 11/2005 | Minda | |
| 2006/0038291 A1 | 2/2006 | Chung et al. | |

FOREIGN PATENT DOCUMENTS

| | | |
|---|---|---|
| JP | 2003-124391 | 4/2003 |
| JP | 2003-234429 | 8/2003 |
| JP | 2004-349361 A | 12/2004 |
| WO | WO-2005/013339 A2 | 2/2005 |

* cited by examiner

*Primary Examiner* — Eugene Lee
(74) *Attorney, Agent, or Firm* — Rabin & Berdo, P.C.

(57) ABSTRACT

A semiconductor device which is capable of preventing interface peeling and a crack from occurring in the vicinity of the edge part of a rewiring layer is provided. The semiconductor device includes a semiconductor substrate, an electrode pad formed on the semiconductor substrate, a first insulation film formed on the semiconductor substrate having a first aperture which exposes the electrode pad, a first conductor film formed on the electrode pad and the first insulation film, an external electrode electrically connected to the first conductor film, and a sealing resin which covers the first conductor film and the first insulation film. The first conductor film includes a plurality of copper layers which are stacked so that an outer edge portion of the first conductor film has a stepped portion.

7 Claims, 16 Drawing Sheets

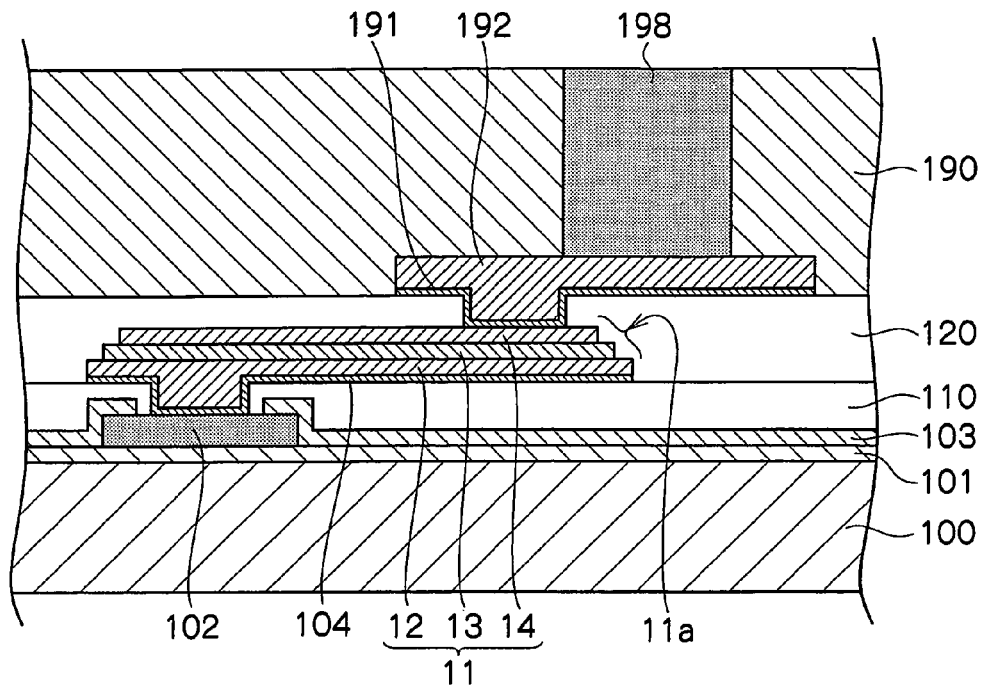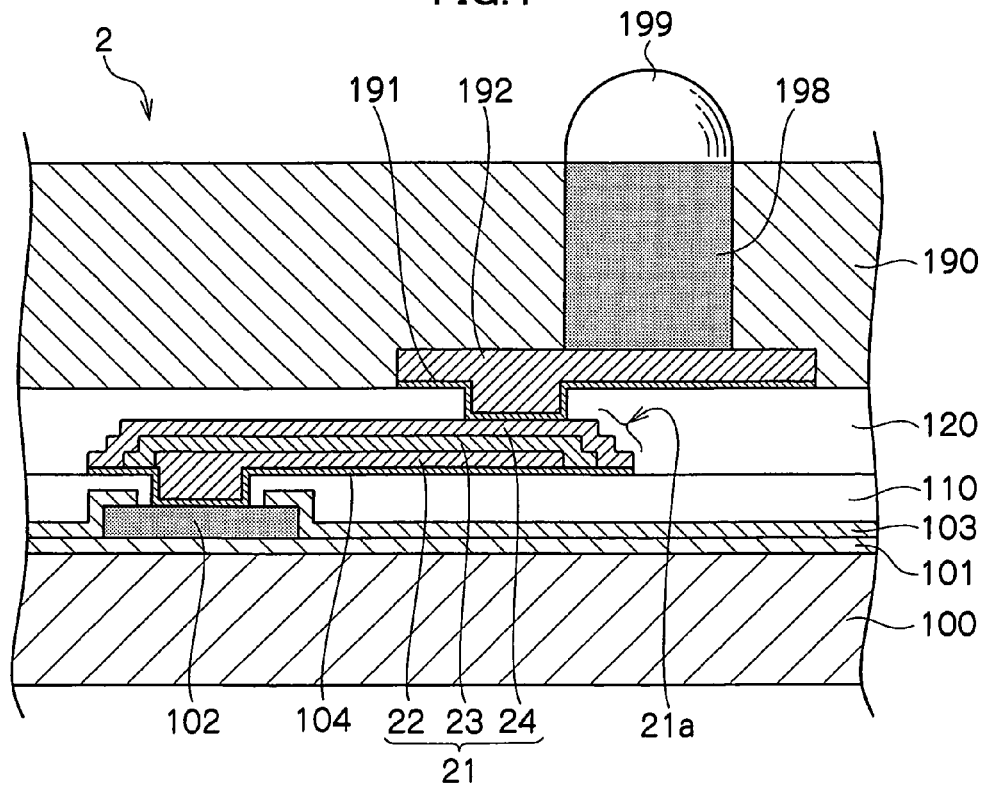

SEMICONDUCTOR DEVICE WITH INTERFACE PEELING PREVENTING REWIRING LAYER

This is a Divisional of U.S. application Ser. No. 11/798,991, filed May 18, 2007, and allowed on Aug. 5, 2010, the subject matter of which is incorporated herein by reference.

CROSS-REFERENCE TO RELATED APPLICATION

This application claims priority under 35 USC 119 from Japanese Patent Application No. 2006-192881, the disclosure of which is incorporated by reference herein.

BACKGROUND OF THE INVENTION

1. Field of the Invention

The present invention relates to a semiconductor device, and particularly to a structure of a rewiring layer which is covered with an insulation film.

2. Description of the Related Art

The conventional semiconductor device has a structure in which a rewiring layer is formed on an interlayer insulation film of the lower layer (hereinafter, to be simply called a lower-layer interlayer insulation film), and the rewiring layer is covered with an interlayer insulation film of the upper layer (hereinafter, to be simply called an upper-layer interlayer insulation film) (for example, refer to Japanese Patent Laid-open Publication No. 2003-234429).

However, the rewiring layer which is formed of copper, or the like, and the interlayer insulation film which is formed of an oxide film, resin, or the like, differ in the physical properties, such as coefficients of their linear expansion, and the like. Therefore, with the structure in which the rewiring layer is simply covered with an upper-layer interlayer insulation film, interface peeling may occur between the rewiring layer and the interlayer insulation film when thermal stresses, or the like, are imposed thereon.

As the art to solve such a problem, there exists, for example, Japanese Patent Laid-open Publication No. 2003-124391 as described below. According to this Japanese Patent Laid-open Publication No. 2003-124391, the semiconductor device is provided with fine irregularities on the surface of the rewiring layer, and by these irregularities, improves the adhesive strength of the interface between the rewiring layer and the interlayer insulation film is improved.

However, the problem which is caused when thermal stresses, or the like, are imposed is not limited to the interface peeling at the adhesion surface between the rewiring layer and the interlayer insulation film. That is to say, with the conventional semiconductor device, when thermal stresses, or the like, are imposed thereon, the stresses are concentrated in the edge part in the vicinity of the rewiring layer. Therefore, there arise such problems as those of that, in the vicinity of this edge part, the rewiring layer and the interlayer insulation film peel off from each other, and that a crack is generated in the interlayer insulation film in the vicinity of the edge part.

SUMMARY OF THE INVENTION

The present invention has been made in view of the above-mentioned problems, and the purpose thereof is to provide a semiconductor device which is capable of preventing interface peeling and a crack occurrence in the vicinity of the edge part of a rewiring layer.

In order to achieve such a purpose, the semiconductor device according to the present invention is configured to comprise a semiconductor substrate; a first insulation film which is formed on the semiconductor substrate, having a first aperture; a first rewiring layer which is formed, ranging from a part of the top surface of the first insulation film to the inside of the first aperture, and which uppermost surface has a size smaller than the size of the region surrounded by the outer periphery of the surface contacting with the first insulation film; and a second insulation film which is formed on the first rewiring layer and on the first insulation film.

According to the present invention, a semiconductor device which is capable of preventing interface peeling and a crack occurrence in the vicinity of the edge part of a rewiring layer can be realized.

BRIEF DESCRIPTION OF THE DRAWINGS

Preferred exemplary embodiments of the present invention will be described in detail based on the following figures, wherein:

FIG. 3 is a process drawing illustrating the fabricating method for the semiconductor device according to the first exemplary embodiment of the present invention;

FIG. 4 is a sectional view illustrating the layer structure of a semiconductor device according to a second exemplary embodiment of the present invention;

DETAILED DESCRIPTION OF THE INVENTION

Hereinbelow, the best mode for carrying out the present invention will be described in detail with reference to the drawings. In the following description, the respective drawings only schematically show the geometry, the size, and the positional relationship to such an extent that the contents of the present invention can be understood, thus the present invention is not limited only to the geometry, the size, and the positional relationship exemplified by the respective drawings. In addition, in the respective drawings, a part of the hatchings is omitted for clarification of the configuration. Further, the numerical values as given in the later description provide only the exemplary ones of the present invention, thus the present invention is not limited to the numerical values exemplified.

[First Exemplary Embodiment]

Figure 1:
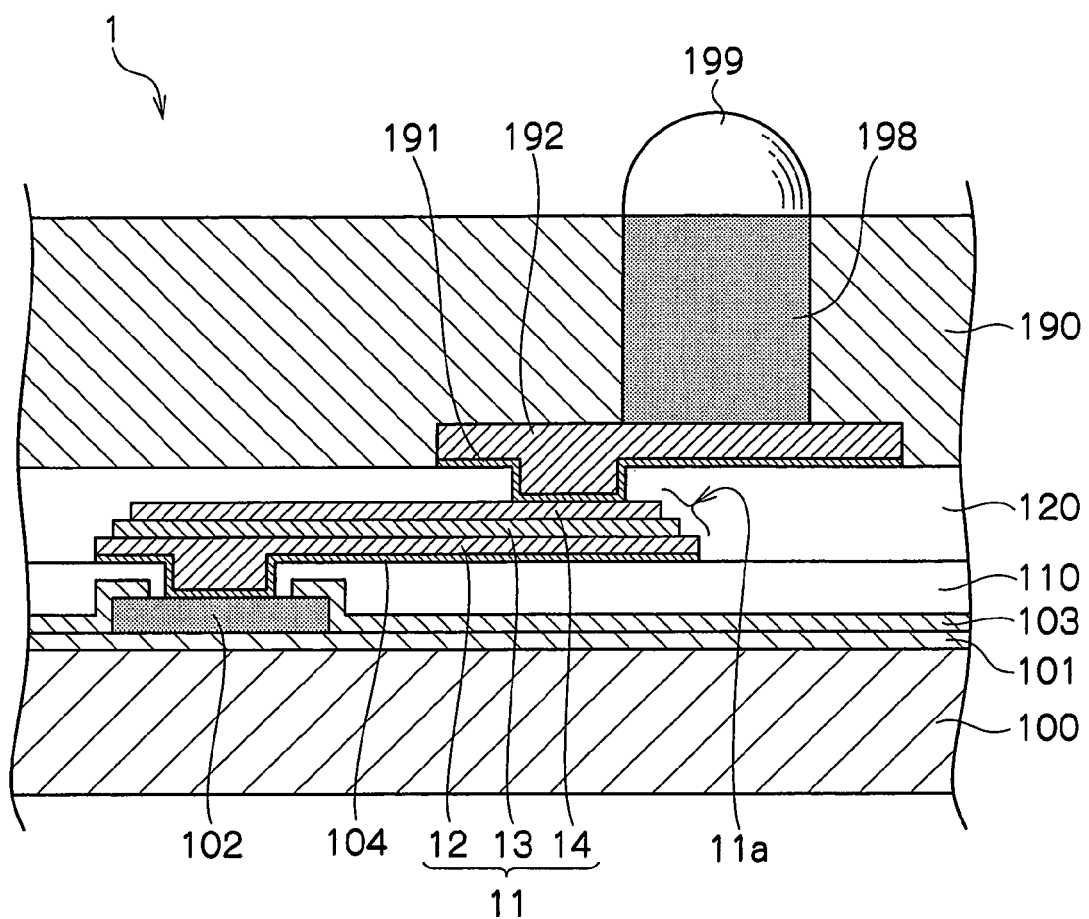
FIG. 1 is a sectional view illustrating the layer structure of a semiconductor device according to a first exemplary embodiment of the present invention.

First, a first exemplary embodiment according to the present invention will be described in detail with reference to the drawings. FIG. 1 is a sectional view illustrating the layer structure of a semiconductor device 1 according to the present exemplary embodiment. However, the sectional view as shown in FIG. 1 is a view obtained when the semiconductor device 1 is cut with a plane perpendicular to the surface of the semiconductor substrate 100.

—Configuration—

As shown in FIG. 1, the semiconductor device 1 has a semiconductor substrate 100, an insulation film 101, an electrode pad 102, a passivation film 103, a first interlayer insulation film 110, a first undercoat metallic layer 104, a first rewiring layer 11, a second interlayer insulation film 120, a second undercoat metallic layer 191, a second rewiring layer 192, a sealing resin 190, an electrode post 198, and a ball-shaped electrode 199.

The semiconductor substrate 100 is, for example, a silicon substrate, or the like. However, the semiconductor substrate 100 is not limited to this, and various substrates, such as a compound semiconductor substrate, a piezoelectric substrate, and the like, are applicable. In addition, in the semiconductor substrate 100, devices, such as a transistor, a capacitor, a resistive device, and the like, (not shown) are formed.

The insulation film 101 formed on the semiconductor substrate 100 is an insulation film which has been formed by depositing an insulator, such as silicon oxide, or the like. This insulation film 101 may be a so-called interlayer insulation film.

On the insulation film 101, an electrode pad 102 is formed. This electrode pad 102 may be formed with a conductor, such as aluminum (Al), copper, polysilicon having conductivity, or the like. The electrode pad 102 is electrically connected to the devices and wiring formed in the semiconductor substrate 100 through a contact wiring (not shown) formed in the insulation film 101.

The passivation film 103 formed, ranging from the top surface of the electrode pad 102 to that of the insulation film 101, is a surface protection film for protecting the surface of the semiconductor substrate 100. This passivation film 103 may be formed by depositing an insulator, such as silicon nitride, or the like. The passivation film 103 has an aperture above the electrode pad 102 for exposing a part thereof.

On the passivation film 103 and on the exposed electrode pad 102, a first interlayer insulation film 110 is formed. The first interlayer insulation film 110 is an insulation film formed of an insulator, such as an organic resin represented by polyimide, and the like, or the like. In addition, the first interlayer insulation film 110 may be provided with a film thickness from the exposed top surface of the electrode pad 102 of, for example, 5 µm (micrometers) or so. The first interlayer insulation film 110 has an aperture above the electrode pad that exposes a part of that electrode pad 102. In addition, by using, for example, a material having photosensitivity (such as photosensitive polyimide, or the like) as the constituent material of the first interlayer insulation film 110, the need for the photolithography process in processing the first interlayer insulation film 110 is eliminated, which allows the number of fabrication processes to be reduced.

From the electrode pad 102 exposed from the aperture of the first interlayer insulation film 110 to a part of the top surface of the first interlayer insulation film 110, a first undercoat metallic film 104 is formed. The first undercoat metallic film 104 is an undercoat film for improving the adhesion between a first rewiring layer 11, which is later described in detail, and the first interlayer insulation film 110. Therefore, the first undercoat metallic film 104 is formed in the portion where the first rewiring layer 11 is formed. For example, when the first rewiring layer 11 is formed with a copper-plated film, this first undercoat metallic film 104 may be formed with a multilayer film of a metallic film made up of one or more of the materials, such as titanium (Ti), chromium (Cr), tungsten (W), and the like, and a copper film formed on this metallic film. In addition, with the first undercoat metallic film 104, the film thickness of the metallic film may be, for example, 1000 to 3000 Å (Angstrom) or so, while the film thickness of the copper film may be, for example, 1000 to 3000 Å or so. However, the materials of the first undercoat metallic film 104, the layer structure and the film thickness of the respective layers may be variously changed, depending upon the materials constituting the first rewiring layer 11, and the like.

On the first undercoat metallic layer 104, as described above, the first rewiring layer 11 is formed. The first rewiring layer 11 is made up of a first metallic film 12 formed on the first undercoat metallic film 104, a second metallic film 13 formed on the first metallic film 12, and a third metallic film 14 formed on the second metallic film 13.

The first metallic film 12 is a copper-plated film formed by the electrolytic deposition method using, for example, the first undercoat metallic film 104 as a seed layer. This first metallic film 12, as described above, is formed only on the first undercoat metallic film 104. Therefore, the size of the top surface of the first metallic film 12 is substantially the same as that of the first undercoat metallic film 104.

The second metallic film 13, like the first metallic film 12, is a copper-plated film formed by the electrolytic deposition method using, for example, the first metallic film 12 as a seed layer. This second metallic film 13, as described above, is formed only on the first metallic film 12. However, the size of the top surface of the second metallic film 13 is smaller than that of the top surface of the first metallic film 12. Therefore, ranging from the side surface of the first metallic film 12 to the side surface of the second metallic film 13, stepped portions are formed.

The third metallic film 14, like the first and second metallic films 12 and 13, is a copper-plated film formed by the electrolytic deposition method using, for example, the second metallic film 13 as a seed layer. This third metallic film 14, as described above, is formed only on the second metallic film 13. However, the size of the top surface of the third metallic film 14 is smaller than that of the top surface of the second metallic film 13. Therefore, from the side surface of the first metallic film 12 to the side surface of the third metallic film 14 through the side surface of the second metallic film 13, stepped portions 11a are formed.

Thus, the first rewiring layer 11 according to the present exemplary embodiment has stepped portions 11a in the outer edge part. By this structure, with the present exemplary embodiment, the stresses which have conventionally been concentrated in the vicinity of the edge part of the rewiring layer, when thermal stresses or the like are imposed, can be distributed, thus the problems of the occurrence of peeling at the interface to a below-described second interlayer insulation film 120 and crack generation in the second interlayer insulation film 120 can be prevented. As a result of this, a semiconductor device 1 having improved reliability can be realized.

In the present exemplary embodiment, a case where the first rewiring layer 11 is formed with three layers of copper-plated film (the first to third rewiring layers 12, 13, 14), has been described as an example. However, the present invention is not limited to this, and it is only required that the first rewiring layer 11 be made up of two or more layers of conductor films, a top surface of which becomes smaller as the position of the layer becomes upper. In addition, the film thickness of the respective metallic films constituting the first rewiring layer 11 may be, for example, a desired film thickness (for example, 5 μm) of the rewiring layer that is divided by the number of layers to be piled up. Further, as the conductor material forming the first rewiring layer 11, copper (Cu) has been mentioned as an example in the present exemplary embodiment. However, the present invention is not limited to this, and various conductor materials, such as gold (Au), leadless solder, and the like, may be used.

The first rewiring layer 11 having a configuration as stated above is covered by a second interlayer insulation film 120. The second interlayer insulation film 120 is assumed to be an interlayer insulation film of the uppermost layer. In addition, this second interlayer insulation film 120 is formed over the entire first interlayer insulation film 110. The second interlayer insulation film 120, like the first interlayer insulation film 110, is an insulation film formed of an insulator, such as an organic resin represented by polyimide, and the like, or the like. In addition, with the second interlayer insulation film 120, the film thickness from the top surface of the first rewiring layer 11 may be, for example, 5 μm or so. The second interlayer insulation film 120 has an aperture above the first rewiring layer 11 that exposes a part of the first rewiring layer 11. In addition, also for the constituent material of the second interlayer insulation film 120, by using, for example, a material having photosensitivity (such as photosensitive polyimide, or the like), as for the constituent material of the first interlayer insulation film 110, the need for the photolithography process in processing the second interlayer insulation film 120 is eliminated, which allows the fabrication process to be reduced.

From the first rewiring layer 11 exposed from the aperture of the second interlayer insulation film 120 to a part of the top surface of the second interlayer insulation film 120, a second undercoat metallic film 191 is formed. The second undercoat metallic film 191 is an undercoat film for improving the adhesion between the later described second rewiring layer 192 and the second interlayer insulation film 120. Therefore, the second undercoat metallic film 191 is formed in the portion where the second rewiring layer 192 is formed. For example, when the second rewiring layer 192 is formed with a copper-plated film, this second undercoat metallic film 191, like the first undercoat metallic film 104, may be formed with a multilayer film of a metallic film made up of one or more of the materials, such as titanium (Ti), chromium (Cr), tungsten (W), and the like, and a copper film formed on this metallic film. In addition, with the second undercoat metallic film 191, the film thickness of the metallic film may be, for example, 1000 to 3000 Å (Angstrom) or so, while the film thickness of the copper film may be, for example, 1000 to 3000 Å or so. However, the materials of the second undercoat metallic film 191, the layer structure and the film thickness of the respective layers may be variously changed, depending upon the materials constituting the second rewiring layer 192, and the like.

On the second undercoat metallic film 191, as described above, the second rewiring layer 192 is formed. This second rewiring layer 192 is a copper-plated film formed by the electrolytic deposition method using, for example, the second undercoat metallic film 191 as a seed layer. This second rewiring layer 192, as described above, is formed only on the second undercoat metallic film 191. Therefore, the size of the top surface of the second rewiring layer 192 is substantially the same as that of the second undercoat metallic film 191. In addition, the film thickness thereof may be, for example, 5 μm or so.

The second interlayer insulation film 120 on which the second rewiring layer 192 and the second undercoat metallic film 191 are thus formed is covered by the sealing resin 190. The sealing resin 190 is an insulation film formed by coating an insulator, such as epoxy resin, urethane resin, or the like. The film thickness thereof may be, for example, 100 μm or so. The sealing resin 190 has an aperture above the second rewiring layer 192 that exposes the second rewiring layer 192.

In the aperture formed in the sealing resin 190, an electrode post 198 is embedded. The electrode post 198 is a copper-plated film formed by the electrolytic deposition method using, for example, the second rewiring layer 192 as a seed layer. However, the present invention is not limited to this, and various conductor materials, such as gold (Au), leadless solder, and the like, may be used to form the electrode post 198. In addition, the top surface of the sealing resin 190 in which the electrode post 198 is embedded is planarized by, for example, the CMP (Chemical and Mechanical Polishing) method, or the like.

On the electrode post 198 exposed in the top surface of the sealing resin 190, a ball-shaped electrode 199 is formed. This ball-shaped electrode 199 is prepared by using, for example, a well-known solder ball loading apparatus to form a solder ball on the top surface of the electrode post 198.

In the present exemplary embodiment, a case where the number of interlayer insulation films formed on the semiconductor substrate 100 is two (the first interlayer insulation film 110 and the second interlayer insulation film 120) has been described as an example. However, the present invention is not limited to this, and is also applicable to a semiconductor device with which, on the semiconductor substrate 100, three or more layers of interlayer insulation film are formed. In this case, the rewiring layer formed in the respective interlayer insulation films is assumed to have the same configuration as that of the first rewiring layer 11.

—Fabricating Method—

Figure 2A:
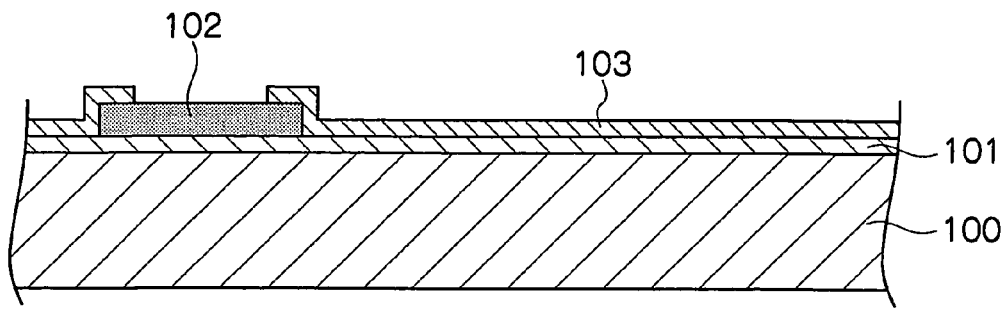
FIG. 2A to FIG. 2M are process drawings illustrating the fabricating method for the semiconductor device according to the first exemplary embodiment of the present invention.

Next, a fabricating method for the semiconductor device 1 having a configuration as described above will be described in detail with reference to the drawings. FIG. 2A to FIG. 3 are process drawings illustrating the fabricating method for the semiconductor device 1 according to the present exemplary embodiment.

With the present fabricating method, first, the semiconductor substrate 100 in which a device, such as a transistor, a capacitor, a resistive device, or the like, is formed is prepared. Next, by using, for example, the CVD (Chemical Vapor Deposition) method to deposit an insulator, such as silicon oxide ($Si_xO_y$), or the like, an insulation film 101 having a film thickness of, for example, 8000 Å or so is formed on the semiconductor substrate 100.

Next, by using, for example, the photolithography technology and the etching technology, a contact hole for exposing a wiring, an electrode pad, or the like (not shown) in the semiconductor substrate 100 is formed in the insulation film 101. Then, by using, for example, the sputtering method or the CVD method to form a conductor film in the contact hole, a contact wiring (not shown) is formed in the insulation film 101.

Next, by using, for example, the sputtering method or the CVD method to deposit a conductor, such as aluminum (Al), copper (Cu), polysilicon having conductivity, or the like, a conductor film is formed on the insulation film 101. Then, by using, for example, the photolithography technology or the etching technology to process the conductor film, the electrode pad 102 which is electrically connected to the contact wiring (not shown) formed in the insulation film 101 is formed on the insulation film 101.

Next, by using, for example, the CVD method to deposit an insulator, such as silicon nitride, or the like, a passivation film 103 is formed on the insulation film 101 and on the electrode pad 102. Then, by using, for example, the photolithography technology and the etching technology to process the passivation film 103, an aperture for exposing a part of the electrode pad 102 is formed in the passivation film 103. Thereby, a layer structure as shown in FIG. 2A is obtained.

Figure 2B:
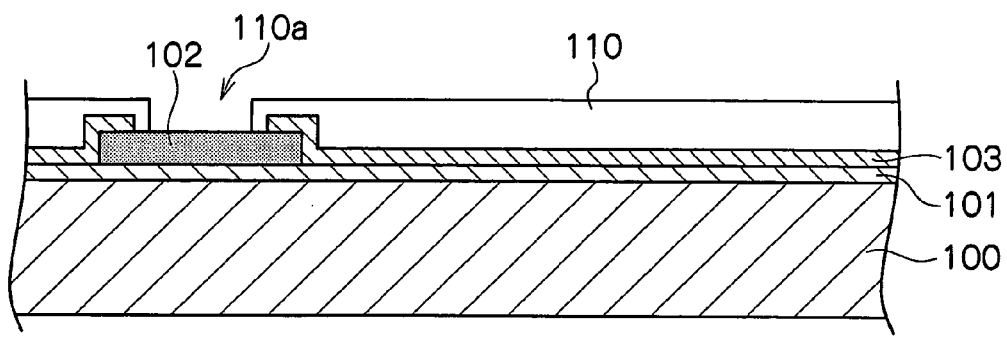

Next, by coating a nonconductive resin, such as polyimide, or the like, on the passivation film 103 and on the exposed electrode pad 102, the first interlayer insulation film 110 covering these is formed. Next, by using, for example, the photolithography technology and the etching technology to process the first interlayer insulation film 110, an aperture 110a for exposing a part of the top surface of the electrode pad 102 is formed in the first interlayer insulation film 110. Thereby, a layer structure as shown in FIG. 2B is obtained. However, in a case where, as the material for the first interlayer insulation film 110, a resin, such as polyimide having photosensitivity, or the like, is used, the aperture 110a may be formed in the first interlayer insulation film 110 simply by exposing a prescribed pattern, which allows the fabrication process to be simplified.

Figure 2C:
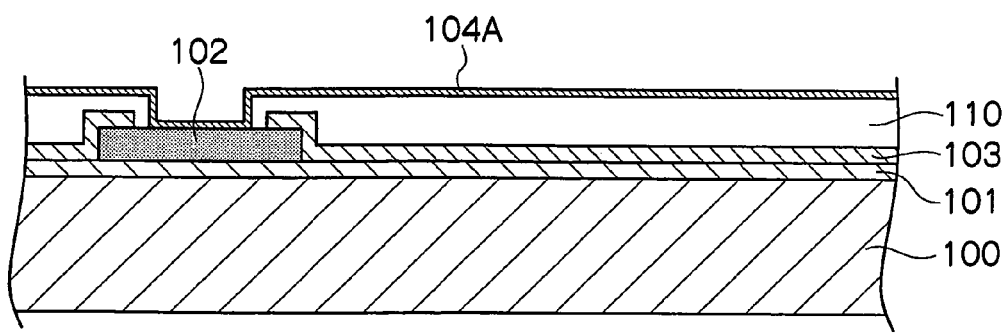

Next, by using, for example, the sputtering method to deposit a metal, such as titanium (Ti), chromium (Cr), tungsten (W), or the like, by one or more layers, and thereafter, by using, for example, the sputtering method to deposit a metal, such as copper (Cu), gold (Au), leadless solder, or the like, a first undercoat metallic film 104A made up of a first metallic film of one or more layers constituted by a metal, such as titanium (Ti), chromium (Cr), tungsten (W), or the like, and a second metallic film constituted by a metal, such as copper (Cu), gold (Au), leadless solder, or the like, is formed on the first interlayer insulation film 110 and in the aperture 110a as shown in FIG. 2C. The metal constituting the second metallic film is appropriately selected depending upon the metal used for the first rewiring layer 11. In the following description, the first rewiring layer 11 is assumed to be a copper-plated film, and the second metallic film is assumed to be a copper film.

Figure 2D:
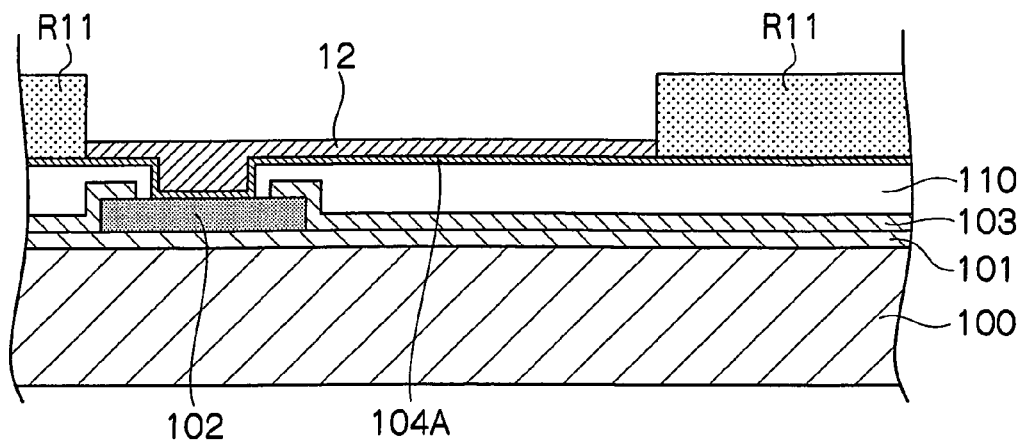

Next, by using, for example, the photolithography technology, a photoresist film R11 having an aperture in the region where the first rewiring layer 11 is to be formed is formed on the first undercoat metallic film 104A. In this case, the portion which is exposed from the aperture of the photoresist film R11 includes the first undercoat metallic film 104A which has been formed in the aperture 110a of the first interlayer insulation film 110. Then, by using the photoresist film R11 as a mask, while employing, for example, the electrolytic deposition method using the first undercoat metallic film 104A as a seed layer for precipitation of copper (Cu), the first metallic film 12 constituted by a copper-plated film is formed on the first undercoat metallic film 104A which is exposed from the aperture of the photoresist film R11 as shown in FIG. 2D.

Figure 2E:
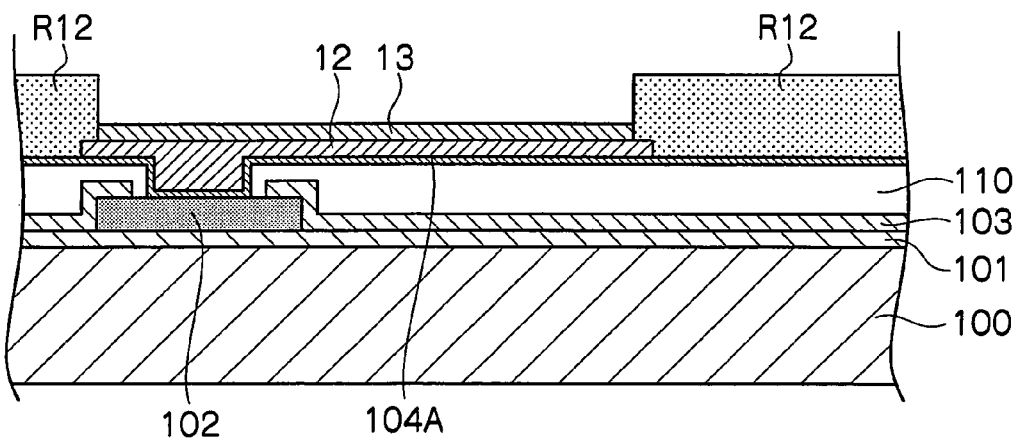

Next, after removing the photoresist film R11, again by using, for example, the photolithography technology, a photoresist film R12 is formed, ranging from the inside of the outer edge of the top surface of the first metallic film 12 to the top surface of the first undercoat metallic film 104A. That is to say, the photoresist film R12 formed in this process has an aperture for exposing a part of the top surface of the first metallic film 12. In other words, the photoresist film R12 has an aperture which is smaller by a size than the top surface of the first metallic film 12. Then, by using the photoresist film R12 as a mask, while employing, for example, the electrolytic deposition method using the first metallic film 12 as a seed layer for precipitation of copper (Cu), the second metallic film 13 constituted by a copper-plated film is formed on the first metallic film 12 which is exposed from the aperture of the photoresist film R12 as shown in FIG. 2E. The size of the top surface of the second metallic film 13 is smaller than the top surface of the first metallic film 12 as described above. Therefore, ranging from the side surface of the first metallic film 12 to the side surface of the second metallic film 13, stepped portions are formed.

Figure 2F:
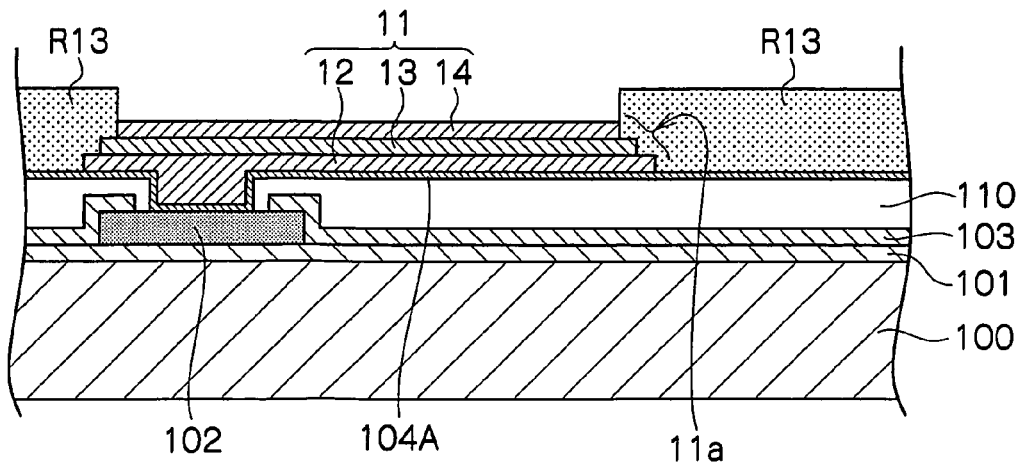

Next, after removing the photoresist film R12, again by using, for example, the photolithography technology, a photoresist film R13 is formed, ranging from the inside of the outer edge of the top surface of the second metallic film 13 to the top surface of the first undercoat metallic film 104A. That is to say, the photoresist film R13 formed in this process has an aperture for exposing a part of the top surface of the second metallic film 13. In other words, the photoresist film R13 has an aperture which is smaller by a size than the top surface of the second metallic film 13. Then, by using the photoresist film R13 as a mask, while employing, for example, the electrolytic deposition method using the second metallic film 13 as a seed layer for precipitation of copper (Cu), the third metallic film 14 constituted by a copper-plated film is formed on the second metallic film 13 which is exposed from the aperture of the photoresist film R13 as shown in FIG. 2F. Thereby, ranging from the inside of the aperture 110a of the first interlayer insulation film 110 to a part of the top surface of the first interlayer insulation film 110, the first rewiring layer 11 made up of the first, second and third metallic films 12, 13 and 14 is formed. The size of the top surface of the third metallic film 14 is smaller than the top surface of the second metallic film 13. Therefore, from the side surface of the first metallic film 12 to the side surface of the third metallic film 14 through the side surface of the second metallic film 13, stepped portions 11a are formed.

Figure 2G:
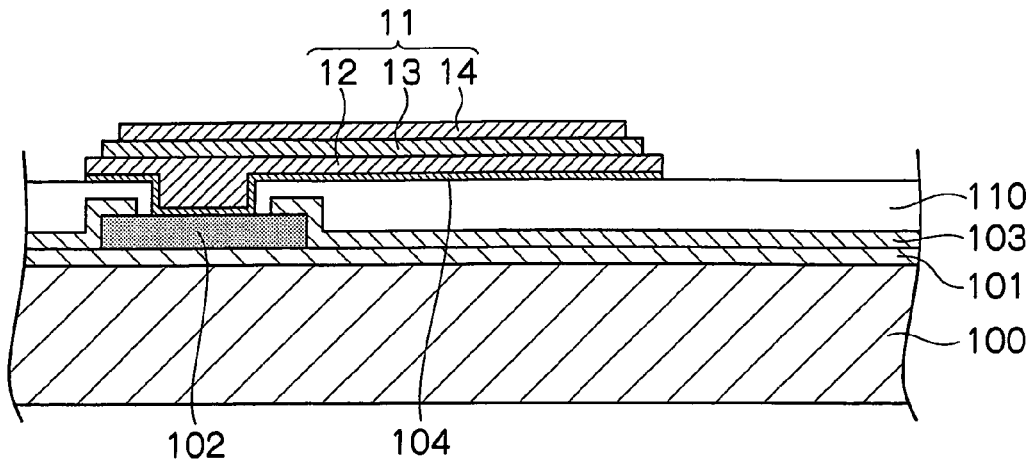

Next, after removing the photoresist film R13, then, by using the first rewiring layer 11 as a mask, while etch-removing the exposed first undercoat metallic film 104A, the first undercoat metallic film 104A other than under the first rewiring layer 11 is removed, and the first interlayer insulation film 110 other than under the first rewiring layer 11 is exposed as shown in FIG. 2G.

Figure 2H:
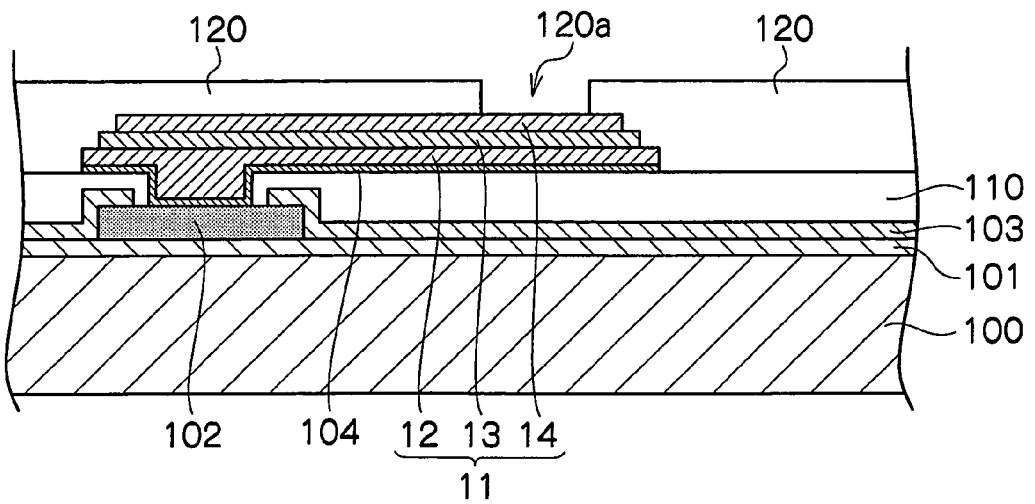

Next, by coating a nonconductive resin, such as polyimide, or the like, on the first rewiring layer 11 and on the first interlayer insulation film 110, the second interlayer insulation film 120 covering these is formed. Next, by using, for example, the photolithography technology and the etching technology to process the second interlayer insulation film 120, an aperture 120a for exposing a part of the top surface of the first rewiring layer 11 is formed in the second interlayer insulation film 120. Thereby, a layer structure as shown in FIG. 2H is obtained. However, in a case where a resin such as polyimide having photosensitivity or the like is used, as the material for the second interlayer insulation film 120, the aperture 120a can be formed in the second interlayer insulation film 120 simply by exposing a prescribed pattern, which allows the fabrication process to be simplified.

Figure 2I:
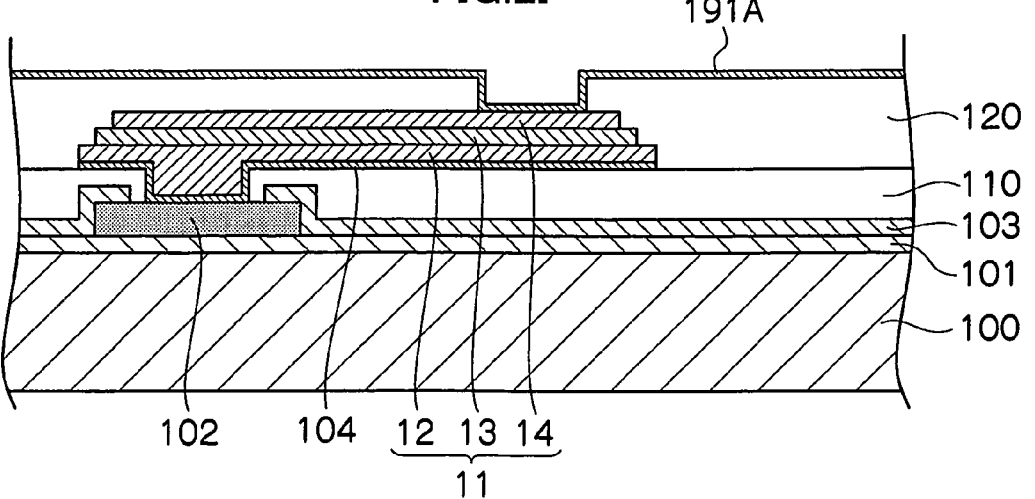

Next, by using, for example, the sputtering method to deposit a metal, such as titanium (Ti), chromium (Cr), tungsten (W), or the like, by one or more layers, and thereafter, by using, for example, the sputtering method to deposit a metal, such as copper (Cu), gold (Au), leadless solder, or the like, a second undercoat metallic film 191A made up of a first metallic film of one or more layers constituted by a metal, such as titanium (Ti), chromium (Cr), tungsten (W), or the like, and a second metallic film constituted by a metal, such as copper (Cu), gold (Au), leadless solder, or the like, is formed on the second interlayer insulation film 120 and in the aperture 120a as shown in FIG. 2I. The metal constituting the second metallic film is appropriately selected depending upon the metal used for the second rewiring layer 192. In the following description, the second rewiring layer 192 is assumed to be a copper-plated film, and the second metallic film is assumed to be a copper film.

Figure 2J:
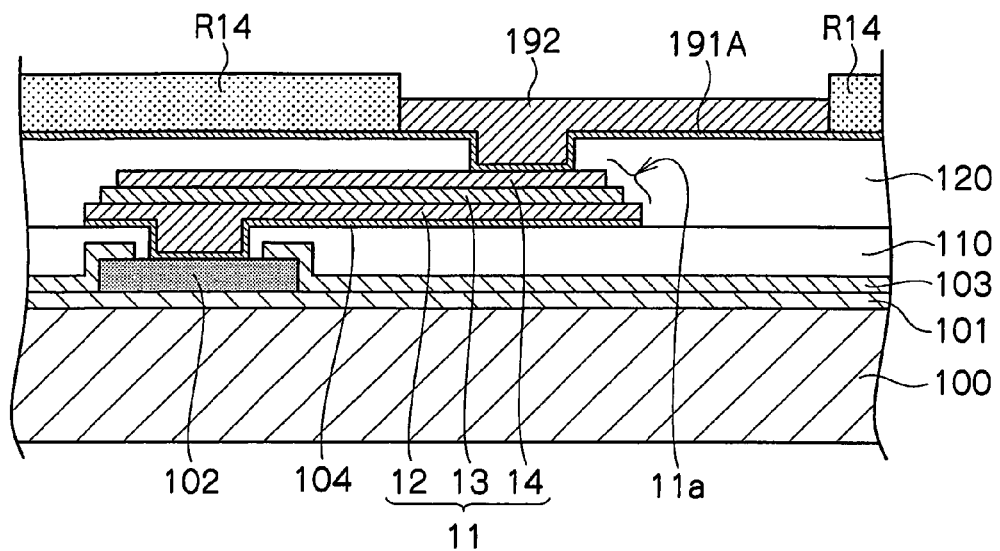

Next, by using, for example, the photolithography technology, a photoresist film R14 having an aperture in the region, where the second rewiring layer 192 is to be formed is formed on the second undercoat metallic film 191A. In this case, the portion which is exposed from the aperture of the photoresist film R14 includes the second undercoat metallic film 191A which has been formed in the aperture 120a of the second interlayer insulation film 120. Then, by using the photoresist film R14 as a mask, while employing, for example, the electrolytic deposition method using the second undercoat metallic film 191A as a seed layer for precipitation of copper (Cu), the second rewiring layer 192 constituted by a copper-plated film is formed on the second undercoat metallic film 191A which is exposed from the aperture of the photoresist film R14 as shown in FIG. 2J.

Figure 2K:
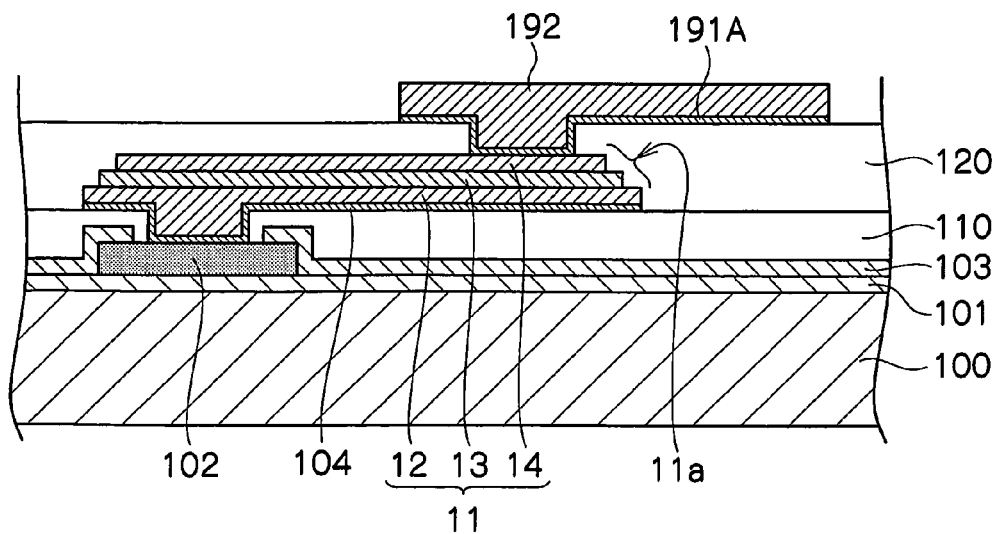

Next, after removing the photoresist film R14, by using the second rewiring layer 192 as a mask, while etch-removing the exposed second undercoat metallic film 191A, the second undercoat metallic film 191A other than under the second rewiring layer 192 is removed, and the second interlayer insulation film 120 other than under the second rewiring layer 192 is exposed as shown in FIG. 2K.

Figure 2L:
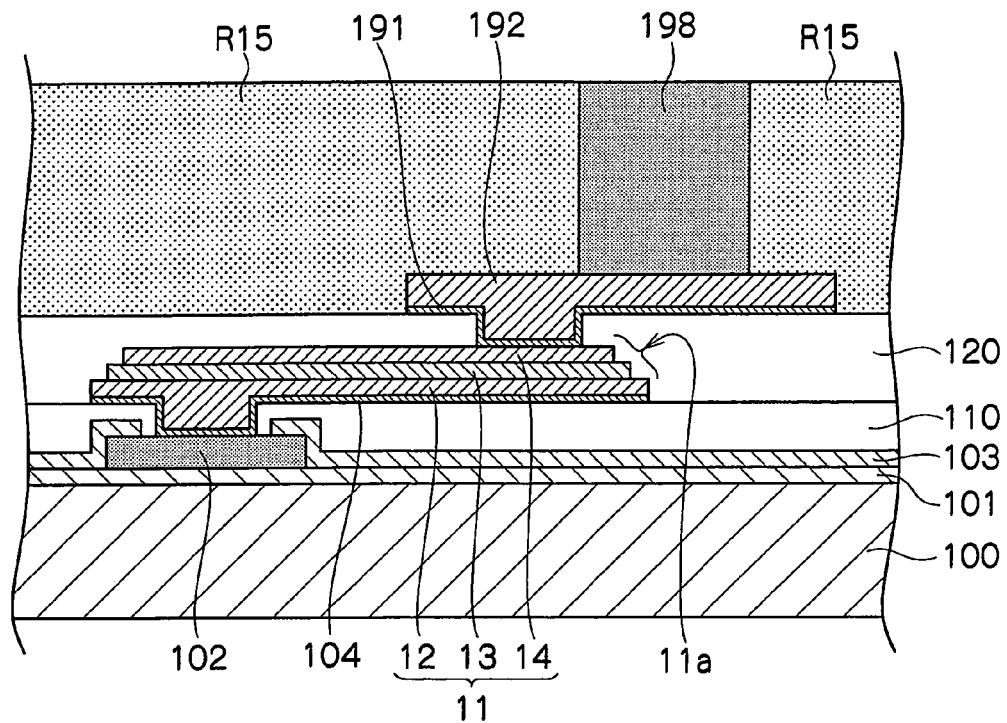

Next, a photoresist film R15 constituted by, for example, a photosensitive resin film, or the like, is stuck on the second rewiring layer 192 and on the second interlayer insulation film 120. Then, by using a prescribed pattern to expose a photoresist film R15, an aperture for exposing a part of the top surface of the second rewiring layer 192 is formed in the photoresist film R15. Then, by using the photoresist film R15 as a mask, while employing, for example, the electrolytic deposition method using the second rewiring layer 192 as a seed layer for precipitation of copper (Cu), the electrode post 198 constituted by a copper-plated film is formed on the second rewiring layer 192 which is exposed from the aperture of the photoresist film R15 as shown in FIG. 2L.

Figure 2M:
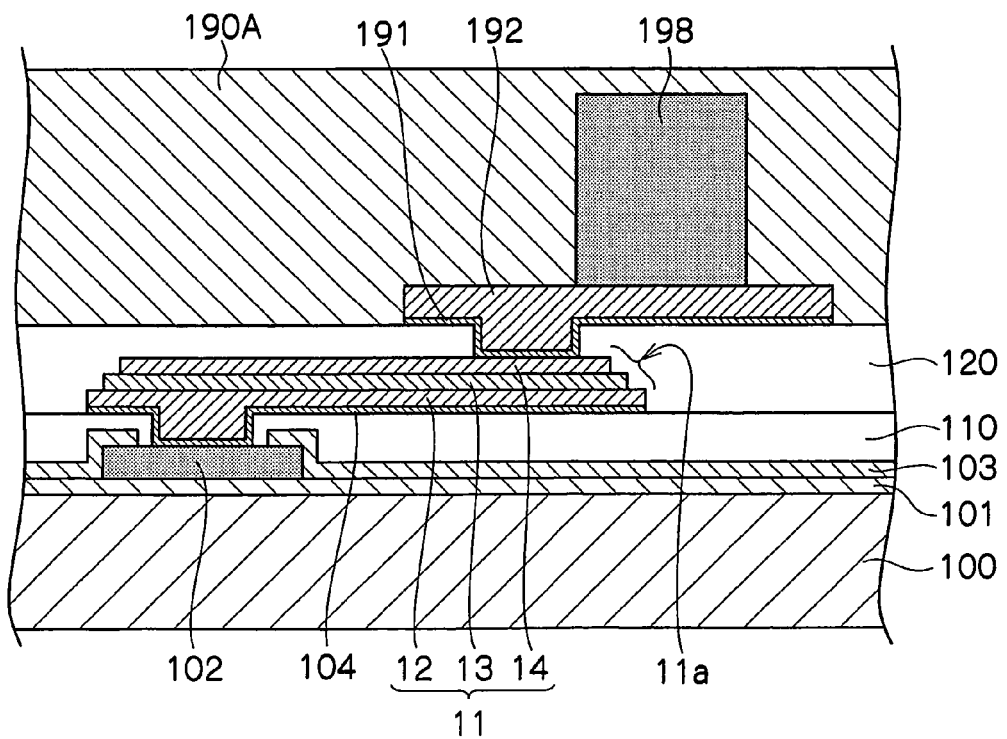

Next, after removing the photoresist film R15, by coating an insulator, such as epoxy resin, urethane resin, or the like, a sealing resin 190A covering the electrode post 198, the second rewiring layer 192 and the second interlayer insulation film 120 are formed as shown in FIG. 2M.

Next, by using, for example, the CMP method to polish the sealing resin 190A from the top surface, the top surface of the sealing resin 190 is panarized, and the top surface of the electrode post 198 is exposed as shown in FIG. 3.

Next, by using, for example, an existing solder ball loading apparatus (not shown), a ball is adhered onto the electrode post 198. Thereby, a ball-shaped electrode 199 is formed on the top surface of the electrode post 198 that is exposed from the sealing resin 190A. Through the above-described processes, the semiconductor device 1 having the layer structure shown in FIG. 1 is fabricated.

As described hereinabove, the semiconductor device 1 according to the present exemplary embodiment has the semiconductor substrate 100; the first interlayer insulation film 110 (the first insulation film) formed on the semiconductor substrate 100 and having the aperture 110a (the first aperture); the first rewiring layer 11 which is formed, ranging from a part of the top surface of the first interlayer insulation film 110 (the first insulation film) to the inside of the aperture 110a (the first aperture), and the uppermost surface of which is smaller than the region surrounded by the outer periphery of the surface contacting with the first interlayer insulation film 110 (the first insulation film); and the second interlayer insulation film 120 (the second insulation film) which is formed on the first rewiring layer 11 and on the first interlayer insulation film 110 (the first insulation film).

In addition, the fabricating method for the semiconductor device 1 according to the present exemplary embodiment has a process of forming the first interlayer insulation film 110 (the first insulation film) on the semiconductor substrate 100; a process of forming the aperture 110a (the first aperture) in the first interlayer insulation film 110 (the first insulation film); and a process of forming the first rewiring layer 11 which uppermost surface has a size smaller than the size of the region surrounded by the outer periphery of the surface contacting with the first interlayer insulation film 110 (the first insulation film), on the first interlayer insulation film 110 (the first insulation film) and in the aperture 110a (the first aperture); and a process of forming the first interlayer insulation film 120 (the second insulation film) covering the first rewiring layer 11 on the first interlayer insulation film 110 (the first insulation film).

As a geometry which uppermost surface has a size smaller than the size of the region surrounded by the outer periphery of the surface contacting with the first interlayer insulation film 110 (the first insulation film), the present exemplary embodiment provides stepped portions 11a formed in the outer edge part of the first rewiring layer 11. By these stepped portions 11a, the stresses which have conventionally been concentrated in the vicinity of the edge part of the rewiring layer, when thermal stresses or the like are imposed, can be distributed, thus the problems of peeling occurring in the vicinity of the edge part of the first rewiring layer 11 at the interface with the second interlayer insulation film 120, and a crack begin generated in the second interlayer insulation film 120, can be prevented. As a result of this, the semiconductor device 1 with improved reliability can be realized.

[Second Exemplary Embodiment]

Next, a second exemplary embodiment of the present invention will be described in detail with reference to the drawings. In the following description, the same components as those of the first exemplary embodiment will be provided with the same reference numerals and signs, and detailed description thereof is omitted. In addition, the components which are not otherwise described are the same as those of the first exemplary embodiment.

FIG. 4 is a sectional view illustrating the layer structure of a semiconductor device 2 according to the present exemplary embodiment. However, the sectional view as shown in FIG. 4 is a view obtained when the semiconductor device 2 is cut with a plane perpendicular to the surface of the semiconductor substrate 100.

—Configuration—

As shown in FIG. 4, the semiconductor device 2 has the same components as those of the semiconductor device 1 according to the first exemplary embodiment, except that the first rewiring layer 11 has been replaced with a first rewiring layer 21. Because the other components are the same as those of the first exemplary embodiment, detailed description thereof is omitted here.

The first rewiring layer 21 is made up of a first metallic film 22 formed in a part of the top surface of the first undercoat metallic film 104; a second metallic film 23 formed, ranging from the top surface of the first metallic film 22 to a part of the top surface of the first undercoat metallic film 104; and a third metallic film 24 formed, ranging from the top surface of the second metallic film 23 to a part of the top surface of the first undercoat metallic film 104.

The first metallic film 22 is a copper-plated film formed by, for example, the electrolytic deposition method using a part of the first undercoat metallic film 104 as a seed layer. This first metallic film 22, as described above, is formed in a part of the top surface of the first undercoat metallic film 104. Therefore, the size of the top surface of the first metallic film 22 is smaller than that of the first undercoat metallic film 104. The first metallic film 22 is not in contact with the outer periphery of the first undercoat metallic film 104.

The second metallic film 23, like the first metallic film 22, is a copper-plated film formed by, for example, the electrolytic deposition method using the first metallic film 22 and a part of the top surface of the first undercoat metallic film 104 as a seed layer. This second metallic film 23, as described above, is formed so as to completely cover the first metallic film 22, ranging from the top surface of the first metallic film 22 to a part of the top surface of the first undercoat metallic film 104. Therefore, the size of the uppermost surface of the second metallic film 23 is smaller than that of the region surrounded by the outer periphery of the surface contacting with the first undercoat metallic film 104. That is to say, the second metallic film 23 has, in the outer edge part thereof, stepped portions which run from the top surface of the first undercoat metallic film 104 up to the top surface of the second metallic film 23.

The third metallic film 24, like the first and second metallic films 22 and 23, is a copper-plated film formed by, for example, the electrolytic deposition method using the second metallic film 23 and a part of the top surface of the first undercoat metallic film 104 as a seed layer. This third metallic film 24, as described above, is formed so as to completely cover from the top surface of the second metallic film 23 to the first undercoat metallic film 104. Therefore, the size of the uppermost surface of the third metallic film 24 is smaller than that of the region surrounded by the outer periphery of the surface contacting with the first undercoat metallic film 104. That is to say, the third metallic film 24 has, in the outer peripheral part thereof, stepped portions which run from the top surface of the first undercoat metallic film 104 to the top surface of the third metallic film 24.

Thus, the first rewiring layer 21 according to the present exemplary embodiment has stepped portions 21a in the outer edge part. By this structure, with the present exemplary embodiment, the stresses which have conventionally been concentrated in the vicinity of the edge part of the rewiring layer, when thermal stresses or the like are imposed, can be distributed, thus the problems of the occurrence of peeling at the interface to the below-described second interlayer insulation film 120, and that a crack generation in the second interlayer insulation film 120 can be prevented. As a result of this, a semiconductor device 2 having improved reliability can be realized. In addition, in the present exemplary embodiment, the stepped portions 21a of the first rewiring layer 21 are stepped portions formed at the time of electrolytic deposition. Therefore, the corner portions of the first rewiring layer 21 provide no sharp geometry, but a smooth geometry. As a result of this, the problems of peeling occurring at the interface to the later described second interlayer insulation film 120, and a crack being generated in the second interlayer insulation film 120 can be further prevented.

In the present exemplary embodiment, a case where the first rewiring layer 21 has been formed with 3 layers of copper-plated film (the first to third rewiring layers 22, 23, 24) has been described as an example However, the present invention is not limited to this, and it is only required that the first rewiring layer 21 be made up of two or more layers of conductor film with which, in the outer edge part of the metallic film of the uppermost layer (in the present exemplary embodiment, the third metallic film 24), stepped portions (in the present exemplary embodiment, the stepped portions 21a) be formed. In addition, the film thickness of the respective metallic films constituting the first rewiring layer 21 may be, for example, a desired film thickness (for example, 5 μm) of the rewiring layer that is divided by the number of layers to be piled up. Further, as the conductor material forming the first rewiring layer 21, copper (Cu) has been mentioned as an example in the present exemplary embodiment. However, the present invention is not limited to this, and various conductor materials, such as gold (Au), leadless solder, and the like, may be used.

In the present exemplary embodiment, a case where the number of interlayer insulation films formed on the semiconductor substrate 100 is two (the first interlayer insulation film 110 and the second interlayer insulation film 120) has been described as an example. However, the present invention is not limited to this, and is also applicable to a semiconductor device with which, on the semiconductor substrate 100, three or more layers of interlayer insulation film are formed. In this case, the rewiring layer formed in the respective interlayer insulation films is assumed to have the same configuration as that of the first rewiring layer 21.

—Fabricating Method—

Figure 5A:
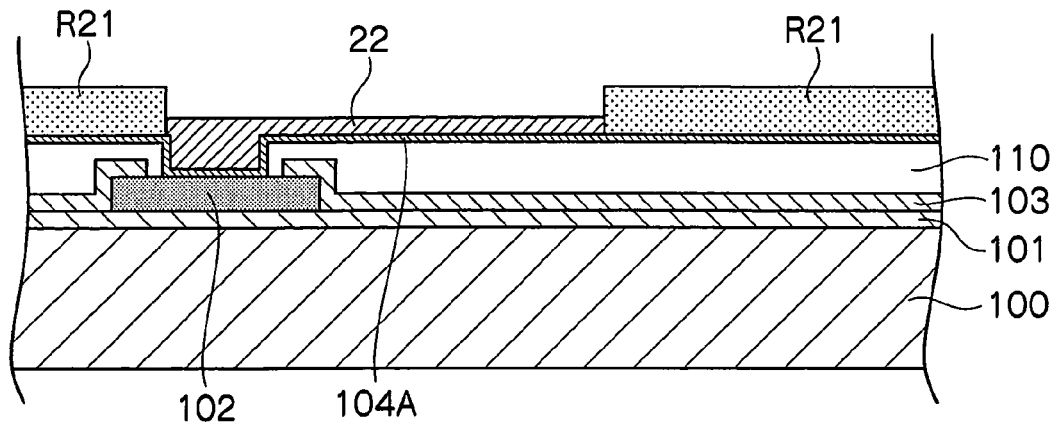
FIG. 5A to FIG. 5C are process drawings illustrating the fabricating method for the semiconductor device according to the second exemplary embodiment of the present invention.
Figure 5B:
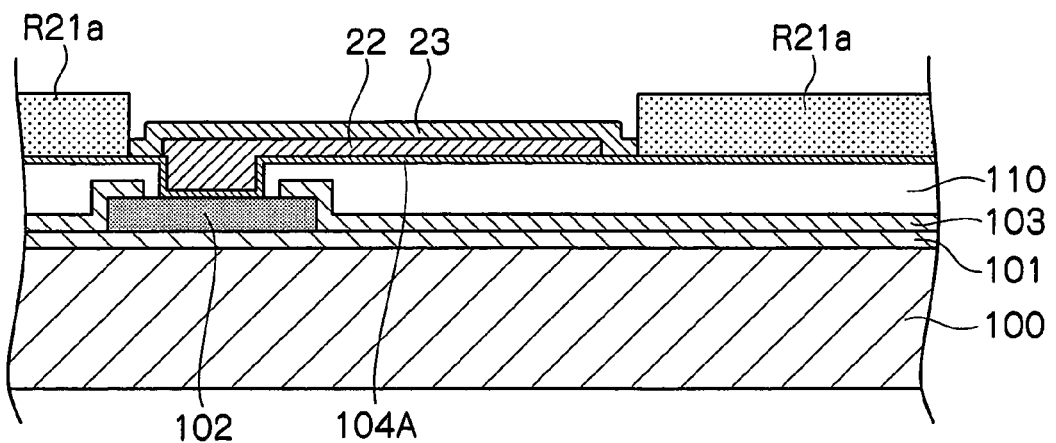
Figure 5C:
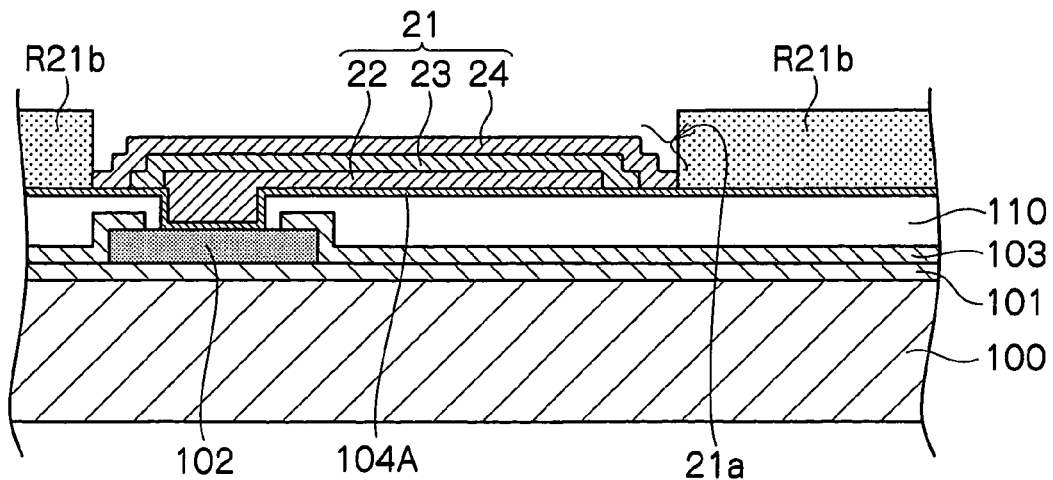

Next, the fabricating method for the semiconductor device 2 having a configuration as described above will be described in detail with reference to the drawings. FIG. 5A to FIG. 5C are process drawings illustrating the fabricating method for the semiconductor device 2 according to the present exemplary embodiment. The processes from preparing the semiconductor substrate 100 to forming the first undercoat metallic film 104A on the first interlayer insulation film 110 and in the inside of the aperture 110a (referring to FIG. 2A to FIG. 2C), and the processes from that of etch-removing the first undercoat metallic film 104A other than under the first rewiring layer 21 (equivalent to the first rewiring layer 11 in the first exemplary embodiment) to that of forming the ball-shaped electrode 199 on the top surface of the electrode post 198 (referring to FIG. 2G to FIG. 3 and FIG. 1) are the same as those in the first exemplary embodiment, thus herein those are omitted from description.

With the present fabricating method, after using the processes as described with reference to FIG. 2A to FIG. 2C in the first exemplary embodiment for forming the first undercoat metallic film 104A on the first interlayer insulation film 110 and in the inside of the aperture 110a, by using, for example, the photolithography technology, a photoresist film R21 having an aperture in the region where the first metallic film 22 is to be formed on the first undercoat metallic film 104A. In this case, the portion which is exposed from the aperture of the photoresist film R21 includes the first undercoat metallic film 104A which has been formed in the aperture 110a of the first interlayer insulation film 110. Then, by using the photoresist film R21 as a mask, while employing, for example, the electrolytic deposition method using the first undercoat metallic film 104A as a seed layer for precipitation of copper (Cu), the first metallic film 22 constituted by a copper-plated film is formed on the first undercoat metallic film 104A which is exposed from the aperture of the photoresist film R21 as shown in FIG. 5A.

Next, by re-exposing the photoresist film R21, the aperture in the photoresist film R21 is widened. As a result of this, the photoresist film R21a after the re-exposure has an aperture which exposes the first metallic film 22 and the first undercoat metallic film 104A around the first metallic film 22. Then, by using the photoresist film R21a as a mask, while employing, for example, the electrolytic deposition method using the first metallic film 22 as a seed layer for precipitation of copper (Cu), the second metallic film 23 constituted by a copper-plated film is formed on the first metallic film 22 and on the first undercoat metallic film 104A which are exposed from the aperture of the photoresist film R21a. Thereby, as shown in FIG. 5B, the second metallic film 23, which completely covers the first metallic film 22 and having stepped portions in the outer peripheral part thereof, is formed.

Next, by re-re-exposing the photoresist film R21, the aperture in the photoresist film R21a is widened. As a result of this, the photoresist film R21b after the re-re-exposure has an aperture which exposes the second metallic film 23 and the first undercoat metallic film 104A around the second metallic film 23. Then, by using the photoresist film R21b as a mask, while employing, for example, the electrolytic deposition method using the second metallic film 23 as a seed layer for precipitation of copper (Cu), the third metallic film 24 constituted by a copper-plated film is formed on the second metallic film 23 and on the first undercoat metallic film 104A which are exposed from the aperture of the photoresist film R21b. Thereby, as shown in FIG. 5C, the third metallic film 24 completely covering the second metallic film 23 and having stepped portions 21a in the outer peripheral part thereof is formed.

Thereafter, by using the same processes as those described with reference to FIG. 2G to FIG. 3 and FIG. 1 in the first exemplary embodiment (however, the first rewiring layer 11 is replaced with the first rewiring layer 21), the semiconductor device 2 having a layer structure as shown in FIG. 4 is fabricated.

As described hereinabove, the semiconductor device 2 according to the present exemplary embodiment has the semiconductor substrate 100, the first interlayer insulation film 110 (the first insulation film) formed on the semiconductor substrate 100 and having the aperture 110a (the first aperture); the first rewiring layer 21 which is formed, ranging from a part of the top surface of the first interlayer insulation film 110 (the first insulation film) to the inside of the aperture 110a (the first aperture), and which uppermost surface has a size smaller than the size of the region surrounded by the outer periphery of the surface contacting with the first interlayer insulation film 110 (the first insulation film); and the second interlayer insulation film 120 (the second insulation film) which is formed on the first rewiring layer 21 and on the first interlayer insulation film 110 (the first insulation film).

In addition, the fabricating method for the semiconductor device 2 according to the present exemplary embodiment has a process of forming the first interlayer insulation film 110 (the first insulation film) on the semiconductor substrate 100; a process of forming the aperture 110a (the first aperture) in the first interlayer insulation film 110 (the first insulation film); a process of forming the first rewiring layer 21 which uppermost surface has a size smaller than the size of the region surrounded by the outer periphery of the surface contacting with the first interlayer insulation film 110 (the first insulation film), on the first interlayer insulation film 110 (the first insulation film) and in the aperture 110a (the first aperture); and a process of forming the first interlayer insulation film 120 (the second insulation film) covering the first rewiring layer 21 on the first interlayer insulation film 110 (the first insulation film).

As a geometry which uppermost surface has a size smaller than the size of the region surrounded by the outer periphery of the surface contacting with the first interlayer insulation film 110 (the first insulation film), the present exemplary embodiment provides stepped portions 21a formed in the outer edge part of the first rewiring layer 21. By this stepped portions 21a, the stresses which have conventionally been concentrated in the vicinity of the edge part of the rewiring layer, when thermal stresses or the like are imposed, can be distributed, thus the problems of that, in the vicinity of the edge part of the first rewiring layer 21, peeling occurs at the interface to the second interlayer insulation film 120, and that a crack is generated in the second interlayer insulation film 120 can be prevented. As a result of this, the semiconductor device 2 which reliability has been improved can be realized.

In addition, in the present exemplary embodiment, by re-exposing the photoresist film R21, R21a which has been used as a mask in forming the metallic film of the lower layer (in the present exemplary embodiment, the first metallic film 22 for the second metallic film 23, as well as the second metallic film 23 for the third metallic film 24), the photoresist film R21a, R21b which is to be used as a mask in forming the metallic film of the upper layer is formed, which allows the process of forming the photoresist film to be simplified.

Further, in the present exemplary embodiment, the stepped portions 21a of the first rewiring layer 21 are steps formed at the time of electrolytic deposition. Therefore, the corner portions of the first rewiring layer 21 provide no sharp geometry, but a smooth geometry. As a result of this, the problems of that peeling occurring at the interface to the second interlayer insulation film 120, and a crack generation in the second interlayer insulation film 120, can be further prevented.

[Third Exemplary Embodiment]

Next, a third exemplary embodiment of the present invention will be described in detail with reference to the drawings. In the following description, the same components as those of the first exemplary embodiment or the second exemplary embodiment will be provided with the same reference numerals and signs, and detailed description thereof is omitted. In addition, the components which are not otherwise described are the same as those of the first exemplary embodiment or the second exemplary embodiment.

Figure 6:
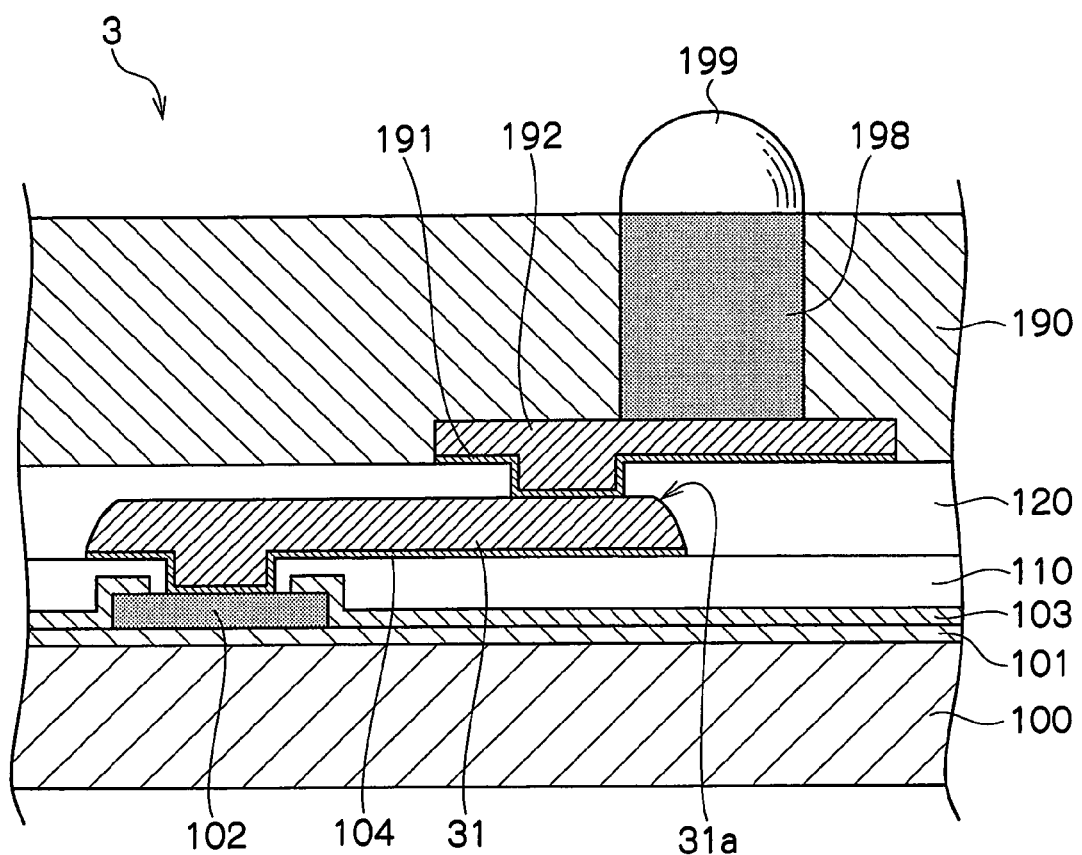
FIG. 6 is a sectional view illustrating the layer structure of a semiconductor device according to a third exemplary embodiment of the present invention.

FIG. 6 is a sectional view illustrating the layer structure of a semiconductor device 3 according to the present exemplary embodiment. However, the sectional view as shown in FIG. 6 is a view obtained when the semiconductor device 3 is cut with a plane perpendicular to the surface of the semiconductor substrate 100.

—Configuration—

As shown in FIG. 6, the semiconductor device 3 has the same components as those of the semiconductor device 1 according to the first exemplary embodiment, except that the first rewiring layer 11 has been replaced with a first rewiring layer 31. Because the other components are the same as those of the first exemplary embodiment, detailed description thereof is omitted here.

The first rewiring layer 31 is a conductor film constituted by, for example, a single layer copper-plated film. With this first rewiring layer 31, the interior angle of an edge part 31a that is formed by the top surface and the side surface is an obtuse angle (larger than 90 deg). That is to say, the first rewiring layer 31 has a tapered outer edge part. In other words, the first rewiring layer 31 has a geometry of broadened foot. Therefore, with the first rewiring layer 31 according to the present exemplary embodiment, the size of the uppermost surface is smaller than that of the region surrounded by the outer periphery of the surface contacting with the first undercoat metallic film 104.

Thus, with the first rewiring layer 31 according to the present exemplary embodiment, the outer edge part has a tapered geometry. By this structure, with the present exemplary embodiment, the stresses which occur, being concentrated in the vicinity of the edge part of the rewiring layer, when thermal stresses or the like are imposed, can be reduced. Thus the problems of that peeling occurs at the interface to a later described second interlayer insulation film 120 and that a crack is generated in the second interlayer insulation film 120 can be prevented. As a result of this, a semiconductor device 3 which reliability has been improved can be realized.

The first rewiring layer 31 having such a broadened-foot geometry can be formed, for example; by etching. Details thereabout will be given in later explanation of the fabricating method.

In the present exemplary embodiment, as the conductor material forming the first rewiring layer 31, copper (Cu) has been mentioned as an example, however, the present invention is not limited to this, and various conductor materials, such as gold (Au), leadless solder, and the like, may be used.

In the present exemplary embodiment, a case where the number of interlayer insulation films formed on the semiconductor substrate 100 is two (the first interlayer insulation film 110 and the second interlayer insulation film 120) has been described as an example. However, the present invention is not limited to this, and is also applicable to a semiconductor device with which, on the semiconductor substrate 100, three or more layers of interlayer insulation film are formed. In this case, the rewiring layer formed in the respective interlayer insulation films is assumed to have the same configuration as that of the first rewiring layer 31.

—Fabricating Method—

Figure 7A:
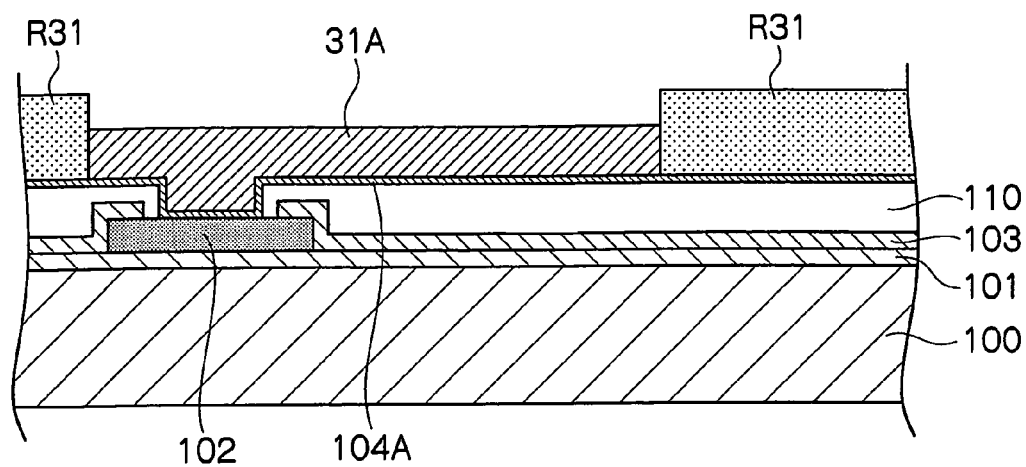
FIG. 7A and FIG. 7B are process drawings illustrating the fabricating method for the semiconductor device according to the third exemplary embodiment of the present invention.
Figure 7B:
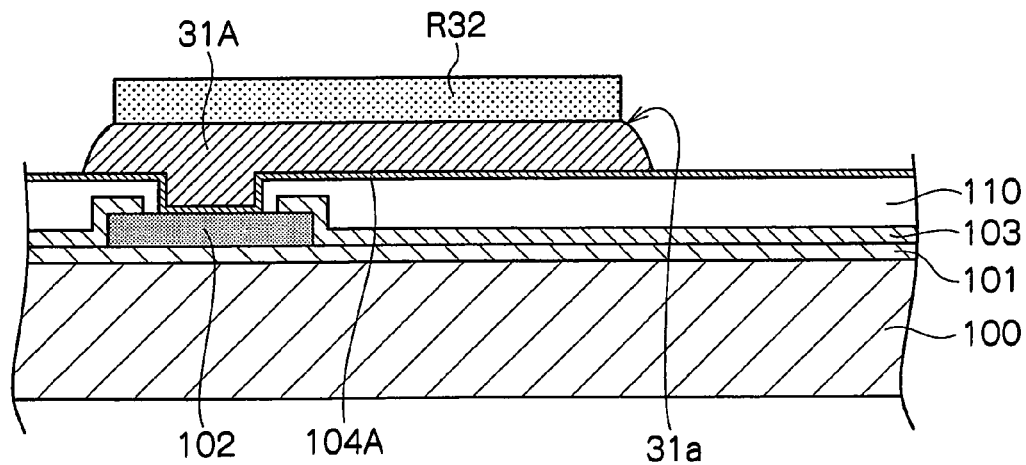

Next, the fabricating method for the semiconductor device 3 having a configuration as described above will be described in detail with reference to the drawings. FIG. 7A and FIG. 7B are process drawings illustrating the fabricating method for the semiconductor device 3 according to the present exemplary embodiment. The processes from preparing the semiconductor substrate 100 to forming the first undercoat metallic film 104A on the first interlayer insulation film 110 and in the inside of the aperture 110*a* (referring to FIG. 2A to FIG. 2C), and the processes of etch-removing the first undercoat metallic film 104A other than under the first rewiring layer 31 (equivalent to the first rewiring layer 11 in the first exemplary embodiment) to that of forming the ball-shaped electrode 199 on the top surface of the electrode post 198 (referring to FIG. 2G to FIG. 3 and FIG. 1) are the same as those in the first exemplary embodiment, thus herein those are quoted for description.

With the present fabricating method, after using the processes as described with reference to FIG. 2A to FIG. 2C in the first exemplary embodiment for forming the first undercoat metallic film 104A on the first interlayer insulation film 110 and in the inside of the aperture 110*a*, then, by using, for example, the photolithography technology, a photoresist film R31 having an aperture in the region, where the first rewiring layer 31 is to be formed, is formed on the first undercoat metallic film 104A. In this case, the portion which is exposed from the aperture of the photoresist film R31 includes the first undercoat metallic film 104A which has been formed in the aperture 110*a* of the first interlayer insulation film 110. Then, by using the photoresist film R31 as a mask, while employing, for example, the electrolytic deposition method using the first undercoat metallic film 104A as a seed layer for precipitation of copper (Cu), the first rewiring layer 31A constituted by a copper-plated film is formed on the first undercoat metallic film 104A which is exposed from the aperture of the photoresist film R31 as shown in FIG. 7A.

Next, after removing the photoresist film R31, by again using, for example, the photolithography technology, a photoresist film R32 is formed in a part of the top surface of the first rewiring layer 31A. In this case, the photoresist film R32 is formed substantially in the central portion of the first rewiring layer 31A so as not to be contacted with the outer periphery of the top surface of the first rewiring layer 31A. Then, by using the photoresist film R32 as a mask, while etching the first rewiring layer 31A, the side surface part of the first rewiring layer 31A which is not covered with the photoresist film R32 is etched. Thereby, as shown in FIG. 7B, the edge part of the first rewiring layer 31A is processed to an edge part 31*a* which is smooth, having an obtuse interior angle. As a result of this, the first rewiring layer 31A is processed to the first rewiring layer 31 which is foot-broadened, having a tapered outer edge part. The first rewiring layer 31A, which is a copper-plated film, may be processed by using, for example, wet etching. As the etchant for etching this first rewiring layer 31A, a sulfuric acid ($H_2SO_4$) solution with a concentration of, for example, 0.5% may be used. In addition, as the etching conditions, the temperature may be set at, for example, room temperature, and the time set at, for example, 10 min or so.

Thereafter, by using the same processes as those described with reference to FIG. 2G to FIG. 3 and FIG. 1 in the first exemplary embodiment (however, the first rewiring layer 11 is replaced with the first rewiring layer 31), the semiconductor device 3 having a layer structure as shown in FIG. 6 is fabricated.

As described hereinabove, the semiconductor device 3 according to the present exemplary embodiment has the semiconductor substrate 100, the first interlayer insulation film 110 (the first insulation film) formed on the semiconductor substrate 100 and having the aperture 110*a* (the first aperture); the first rewiring layer 31 which is formed, ranging from a part of the top surface of the first interlayer insulation film 110 (the first insulation film) to the inside of the aperture 110*a* (the first aperture), and which uppermost surface has a size smaller than the size of the region surrounded by the outer periphery of the surface contacting with the first interlayer insulation film 110 (the first insulation film); and the second interlayer insulation film 120 (the second insulation film) which is formed on the first rewiring layer 31 and on the first interlayer insulation film 110 (the first insulation film).

In addition, the fabricating method for the semiconductor device 3 according to the present exemplary embodiment has a process of forming the first interlayer insulation film 110 (the first insulation film) on the semiconductor substrate 100; a process of forming the aperture 110*a* (the first aperture) in the first interlayer insulation film 110 (the first insulation film); a process of forming the first rewiring layer 31 which uppermost surface has a size smaller than the size of the region surrounded by the outer periphery of the surface contacting with the first interlayer insulation film 110 (the first insulation film), on the first interlayer insulation film 110 (the first insulation film) and in the aperture 110*a* (the first aperture); and a process of forming the first interlayer insulation film 120 (the second insulation film) covering the first rewiring layer 31 on the first interlayer insulation film 110 (the first insulation film).

As a geometry which uppermost surface has a size smaller than the size of the region surrounded by the outer periphery of the surface contacting with the first interlayer insulation film 110 (the first insulation film), the present exemplary embodiment provides a tapered geometry for the outer edge part of the first rewiring layer 31. By this tapered geometry, the stresses which, when thermal stresses or the like are imposed, have conventionally occurred in the vicinity of the edge part of the rewiring layer can be reduced, thus the problems of that, in the vicinity of the edge part of the first rewiring layer 31, peeling occurs at the interface to the second interlayer insulation film 120, and that a crack is generated in the second interlayer insulation film 120 can be prevented. As a result of this, the semiconductor device 3 having improved reliability can be realized.

[Fourth Exemplary embodiment]

Next, a fourth exemplary embodiment of the present invention will be described in detail with reference to the drawings. In the following description, the same components as those of any of the first exemplary embodiment to the third exemplary embodiment will be provided with the same reference numerals and signs, and detailed description thereof is omitted. In addition, the components which are not otherwise described are the same as those of any of the first exemplary embodiment to the third exemplary embodiment.

Figure 8:
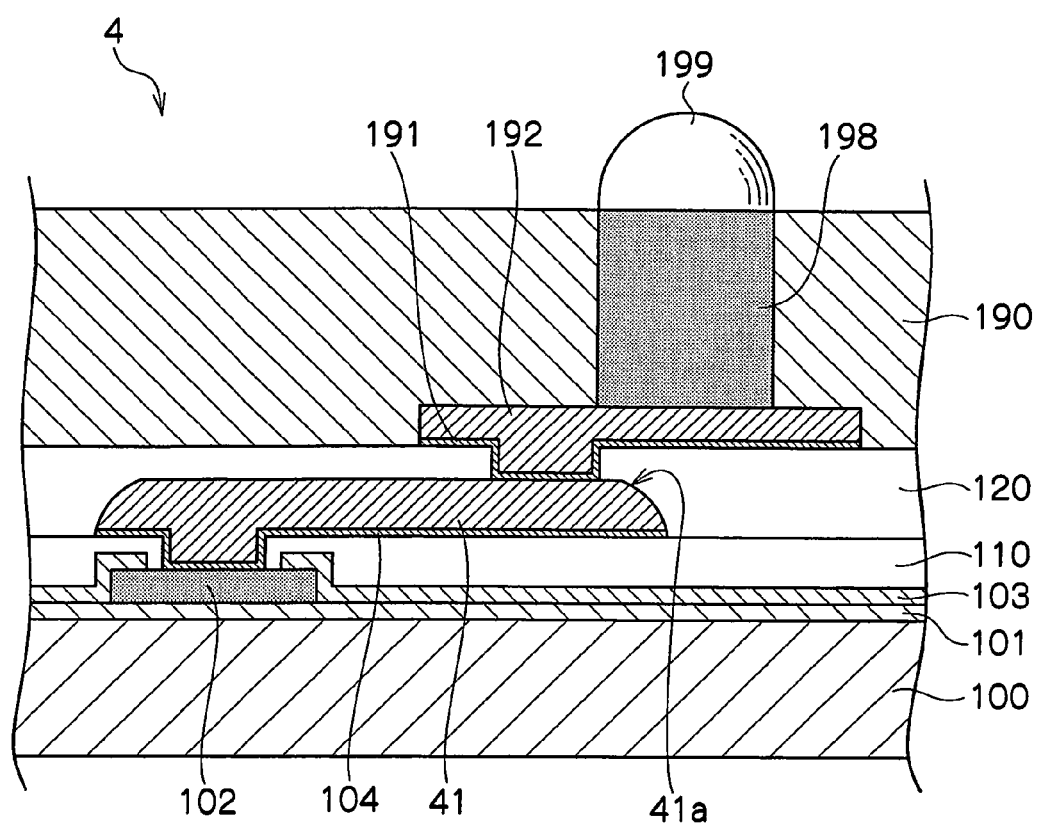
FIG. 8 is a sectional view illustrating the layer structure of a semiconductor device according to the fourth exemplary embodiment of the present invention.

FIG. 8 is a sectional view illustrating the layer structure of a semiconductor device 4 according to the present exemplary embodiment. However, the sectional view as shown in FIG. 8 is a view obtained when the semiconductor device 4 is cut with a plane perpendicular to the surface of the semiconductor substrate 100.

—Configuration—

As shown in FIG. 8, the semiconductor device 4 has the same components as those of the semiconductor device 1 according to the first exemplary embodiment, except that the first rewiring layer 11 has been replaced with a first rewiring layer 41. Because the other components are the same as those of the first exemplary embodiment, detailed description thereof is omitted here.

The first rewiring layer 41 is a conductor film constituted by, for example, a single layer copper-plated film. With this first rewiring layer 41, the interior angle of an edge part 41a that is formed by the top surface and the side surface is an obtuse angle (larger than 90 deg). That is to say, the first rewiring layer 41 has a tapered outer edge part. In other words, the first rewiring layer 41 has a geometry of broadened foot. Therefore, with the first rewiring layer 41 according to the present exemplary embodiment, the size of the uppermost surface is smaller than that of the region surrounded by the outer periphery of the surface contacting with the first undercoat metallic film 104.

Thus, with the first rewiring layer 41 according to the present exemplary embodiment, the outer edge part has a tapered geometry. By this structure, with the present exemplary embodiment, the stresses which occur in the vicinity of the edge part, when thermal stresses or the like are imposed, can be reduced. Thus the problems of peeling occurring at the interface to the second interlayer insulation film 120 and crack generation in the second interlayer insulation film 120 can be prevented. As a result of this, a semiconductor device 4 having improved reliability can be realized. The edge part 41a in the present exemplary embodiment is more heavily rounded than, for example, the edge part 31a in the third exemplary embodiment. Therefore, the present exemplary embodiment, as compared to, for example, the third exemplary embodiment, can more effectively reduce the stresses occurring in the vicinity of the edge part of the first rewiring layer 41.

The first rewiring layer 41 having such a broadened-foot geometry can be formed by, for example, wet etching involving application of reverse electrolysis using the potential difference which is reverse in polarity to the potential difference used for formation of the first rewiring layer 41. Details thereabout will be given in later explanation of the fabricating method.

In the present exemplary embodiment, as the conductor material forming the first rewiring layer 41, copper (Cu) has been mentioned as an example, however, the present invention is not limited to this, and various conductor materials, such as gold (Au), leadless solder, and the like, may be used.

In the present exemplary embodiment, a case where the number of interlayer insulation films formed on the semiconductor substrate 100 is two (the first interlayer insulation film 110 and the second interlayer insulation film 120) has been described as an example, however, the present invention is not limited to this, and is also applicable to a semiconductor device with which, on the semiconductor substrate 100, three or more layers of interlayer insulation film are formed. In this case, the rewiring layer formed in the respective interlayer insulation films is assumed to have the same configuration as that of the first rewiring layer 41.

—Fabricating Method—

Figure 9A:
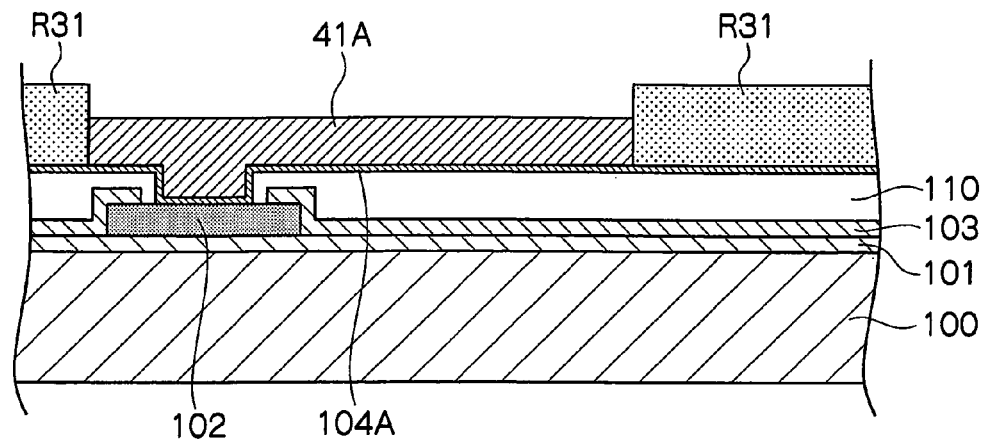
FIG. 9A and FIG. 9B are process drawings illustrating the fabricating method for the semiconductor device according to the fourth exemplary embodiment of the present invention.
Figure 9B:
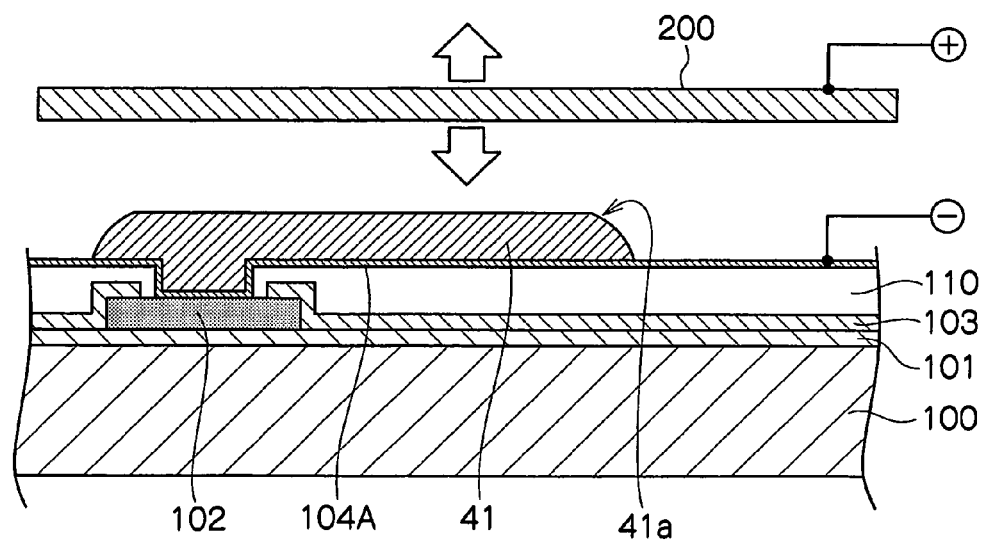

Next, the fabricating method for the semiconductor device 4 having a configuration as described above will be described in detail with reference to the drawings. FIG. 9A and FIG. 9B are process drawings illustrating the fabricating method for the semiconductor device 4 according to the present exemplary embodiment. The processes from preparing the semiconductor substrate 100 to forming the first undercoat metallic film 104A on the first interlayer insulation film 110 and in the inside of the aperture 110a (referring to FIG. 2A to FIG. 2C), and the processes from etch-removing the first undercoat metallic film 104A other than under the first rewiring layer 41 (equivalent to the first rewiring layer 11 in the first exemplary embodiment) to forming the ball-shaped electrode 199 on the top surface of the electrode post 198 (referring to FIG. 2G to FIG. 3 and FIG. 1) are the same as those in the first exemplary embodiment, thus herein those are quoted for description.

With the present fabricating method, after using the processes as described with reference to FIG. 2A to FIG. 2C in the first exemplary embodiment for forming the first undercoat metallic film 104A on the first interlayer insulation film 110 and in the inside of the aperture 110a, then, by using, for example, the photolithography technology, a photoresist film R41 having an aperture in the region where the first rewiring layer 41 is to be formed is formed on the first undercoat metallic film 104A. In this case, the portion which is exposed from the aperture of the photoresist film R41 includes the first undercoat metallic film 104A which has been formed in the aperture 110a of the first interlayer insulation film 110. Then, by using the photoresist film R41 as a mask, while employing, for example, the electrolytic deposition method using the first undercoat metallic film 104A as a seed layer for precipitation of copper (Cu), the first rewiring layer 41A constituted by a copper-plated film is formed on the first undercoat metallic film 104A which is exposed from the aperture of the photoresist film R41 as shown in FIG. 9A.

Next, after removing the photoresist film R41, the semiconductor substrate 100, on which the first rewiring layer 41A is formed, is immersed in the etchant together with a prescribed electrode 200. As the etchant in this case, a sulfuric acid ($H_2SO_4$) solution with a concentration of, for example, 5%, and at room temperature may be used. Then, the operation of separating the prescribed electrode 200 from the first rewiring layer 41 A and the operation of bringing the prescribed electrode 200 close to the first rewiring layer 41A are repeatedly performed in a prescribed period of time (for example, 1 min) by a prescribed number of times (for example, 30 times). However, in performing the operation of separating the prescribed electrode 200 from the first rewiring layer 41A, the potential difference which is reverse in polarity to the potential difference applied across the prescribed electrode and the first undercoat metallic film 104A in precipitating the first rewiring layer 41 by the electrolytic deposition method is applied to the prescribed electrode 200 and the first undercoat metallic film 104A, as described above. In the present exemplary embodiment, the prescribed electrode 200 is provided with, for example, a positive potential, while the first undercoat metallic film 104A being provided with a negative potential. Thereby, as shown in FIG. 9B, the edge part of the first rewiring layer 41A is processed to the edge part 41a which is smooth, having an obtuse interior angle. As a result of this, the first rewiring layer 41A is processed to the first rewiring layer 41 which is foot-broadened, having a tapered outer edge part.

Thereafter, by using the same processes as those described with reference to FIG. 2G to FIG. 3 and FIG. 1 in the first exemplary embodiment (however, the first rewiring layer 11 is replaced with the first rewiring layer 41), the semiconductor device 4 having a layer structure as shown in FIG. 8 is fabricated.

As described hereinabove, the semiconductor device 4 according to the present exemplary embodiment has the semiconductor substrate 100, the first interlayer insulation film 110 (the first insulation film) formed on the semiconductor substrate 100 and having the aperture 110a (the first aperture); the first rewiring layer 41 which is formed, ranging from a part of the top surface of the first interlayer insulation film 110 (the first insulation film) to the inside of the aperture 110a (the first aperture), and which uppermost surface has a size smaller than the size of the region surrounded by the outer periphery of the surface contacting with the first interlayer insulation film 110 (the first insulation film); and the second interlayer insulation film 120 (the second insulation film) which is formed on the first rewiring layer 41 and on the first interlayer insulation film 110 (the first insulation film).

In addition, the fabricating method for the semiconductor device 4 according to the present exemplary embodiment has a process of forming the first interlayer insulation film 110 (the first insulation film) on the semiconductor substrate 100; a process of forming the aperture 110a (the first aperture) in the first interlayer insulation film 110 (the first insulation film); a process of forming the first rewiring layer 41 which uppermost surface has a size smaller than the size of the region surrounded by the outer periphery of the surface contacting with the first interlayer insulation film 110 (the first insulation film), on the first interlayer insulation film 110 (the first insulation film) and in the aperture 110a (the first aperture); and a process of forming the first interlayer insulation film 120 (the second insulation film) covering the first rewiring layer 41 on the first interlayer insulation film 110 (the first insulation film).

As a geometry which uppermost surface has a size smaller than the size of the region surrounded by the outer periphery of the surface contacting with the first interlayer insulation film 110 (the first insulation film), the present exemplary embodiment provides a tapered geometry for the outer edge part of the first rewiring layer 41. By this tapered geometry, the stresses which, when thermal stresses, or the like, are imposed, have conventionally occurred in the vicinity of the edge part of the rewiring layer can be reduced, thus the problems of, in the vicinity of the edge part of the first rewiring layer 41, peeling occurring at the interface to the second interlayer insulation film 120, and crack generation in the second interlayer insulation film 120 can be prevented. As a result of this, the semiconductor device 4 having improved reliability can be realized.

The edge part 41a in the present exemplary embodiment is more heavily rounded than, for example, the edge part 31a in the third exemplary embodiment. Therefore, the present exemplary embodiment, as compared to, for example, the third exemplary embodiment, can more effectively reduce the stresses occurring in the vicinity of the edge part of the first rewiring layer 41.

[Fifth Exemplary Embodiment]

Next, a fifth exemplary embodiment of the present invention will be described in detail with reference to the drawings. In the following description, the same components as those of any of the first exemplary embodiment to the fourth exemplary embodiment will be provided with the same reference numerals and signs, and detailed description thereof is omitted. In addition, the components which are not otherwise described are the same as those of any of the first exemplary embodiment to the fourth exemplary embodiment.

Figure 10:
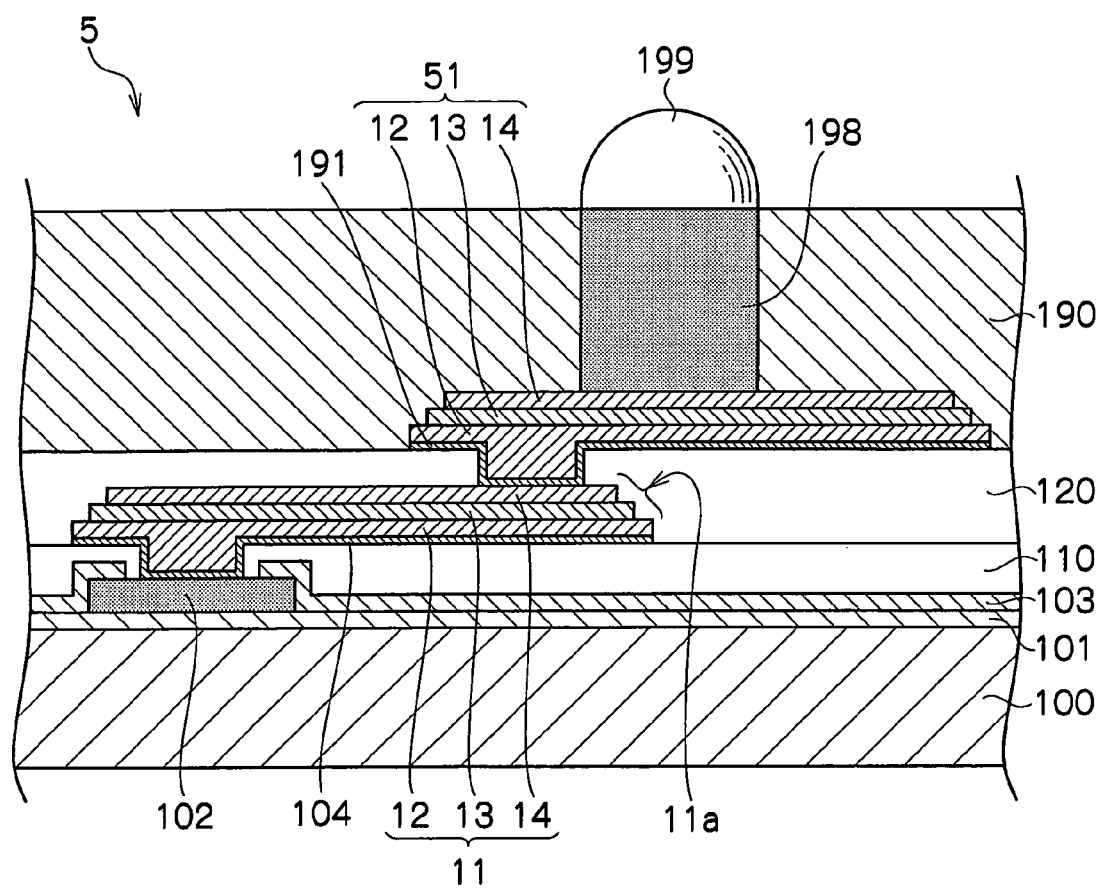
FIG. 10 is a sectional view illustrating the layer structure of a semiconductor device according to a fifth exemplary embodiment of the present invention.

FIG. 10 is a sectional view illustrating the layer structure of a semiconductor device 5 according to the present exemplary embodiment. However, the sectional view as shown in FIG. 10 is a view obtained when the semiconductor device 5 is cut with a plane perpendicular to the surface of the semiconductor substrate 100. In addition, in the present exemplary embodiment, for simplification of the description, a configuration in which the structure according to the present exemplary embodiment is applied to the semiconductor device 1 according to the first exemplary embodiment, is described as an example. However, the present invention is not limited to this, and to any of the semiconductor devices 2 to 4 as described in the second exemplary embodiment to the fourth exemplary embodiment, the structure according to the present exemplary embodiment is also applicable.

—Configuration—

As shown in FIG. 10, with the semiconductor device 5 according to the present exemplary embodiment, a second rewiring layer 51 which is formed on the second interlayer insulation film 120, which is the uppermost layer, has the same configuration as that of the first rewiring layer 11 according to the first exemplary embodiment. Because the other configurations are the same as those in the first exemplary embodiment (however, the exemplary embodiments 2 to 4 are not excluded), detailed description thereof is omitted here.

—Fabricating Method—

In addition, the fabricating method for the semiconductor device 5 according to the present exemplary embodiment can be realized by replacing the formation process for the second rewiring layer 192 as described with reference to FIG. 2J in the fabricating method for the semiconductor device 1 as given in the first exemplary embodiment, with the same formation process as the formation process for the first rewiring layer 11 as described with reference to FIG. 2D to FIG. 2F. Therefore, detailed description thereof is omitted herein.

As described hereinabove, the semiconductor device 5 according to the present exemplary embodiment has the same configuration as that of any of the exemplary embodiments 1 to 4. In addition, the fabricating method for the semiconductor device 5 according to the present exemplary embodiment has the same configuration as that of any of the exemplary embodiments 1 to 4. Therefore, the present exemplary embodiment can provide the same effect as that of any of the exemplary embodiments 1 to 4.

In addition, with the semiconductor device 5 according to the present exemplary embodiment, the first interlayer insulation film 120 (the second insulation film) has an aperture 120*a* (a second aperture) for exposing a part of the first rewiring layer (11, 21, 31, or 41). In addition, the semiconductor device 5 according to the present exemplary embodiment has further the second rewiring layer 51 which is formed on the second interlayer insulation film 120 (the second insulation film) and in the inside of the aperture 120*a* (the second aperture), and which uppermost surface has a size smaller than the size of the region surrounded by the outer periphery of the surface contacting with the second interlayer insulation film 120 (the second insulation film), and a sealing resin 190 which is formed on the second rewiring layer 51 and the second interlayer insulation film 120 (the second insulation film).

Further, the fabricating method for the semiconductor device 5 according to the present exemplary embodiment has further the process of forming the aperture 120*a* (the second aperture) for exposing a part of the first rewiring layer (11, 21, 31, or 41) in the second interlayer insulation film 120 (the second insulation'film); the process of forming the second rewiring layer 51 which uppermost surface has a size smaller than the size of the region surrounded by the outer periphery of the surface contacting with the second interlayer insulation film 120 (the second insulation film), on the second interlayer insulation film 120 (the second insulation film) and in the inside of the aperture 120*a* (the second aperture); and the process of forming the sealing resin 190 covering the second rewiring layer 51 on the second interlayer insulation film 120 (the second insulation film).

According to this configuration and fabricating method, the semiconductor device 5 according to the present exemplary embodiment can also prevent the problems of interface peeling which occurs in the vicinity of the edge part of the rewiring layer (the second rewiring layer 51) formed on the uppermost layer, between it and the sealing resin 190, and a crack, and the like, which occur in the sealing resin 190, due to the same reason as that for the first rewiring layer (11, 21, 31, or 41).

[Sixth Exemplary Embodiment]

Next, a sixth exemplary embodiment of the present invention will be described in detail with reference to the drawings. In the following description, the same components as those of any of the first exemplary embodiment to the fifth exemplary embodiment will be provided with the same reference numerals and signs, and detailed description thereof is omitted. In addition, the components which are not otherwise described are the same as those of any of the first exemplary embodiment to the fifth exemplary embodiment.

Figure 11:
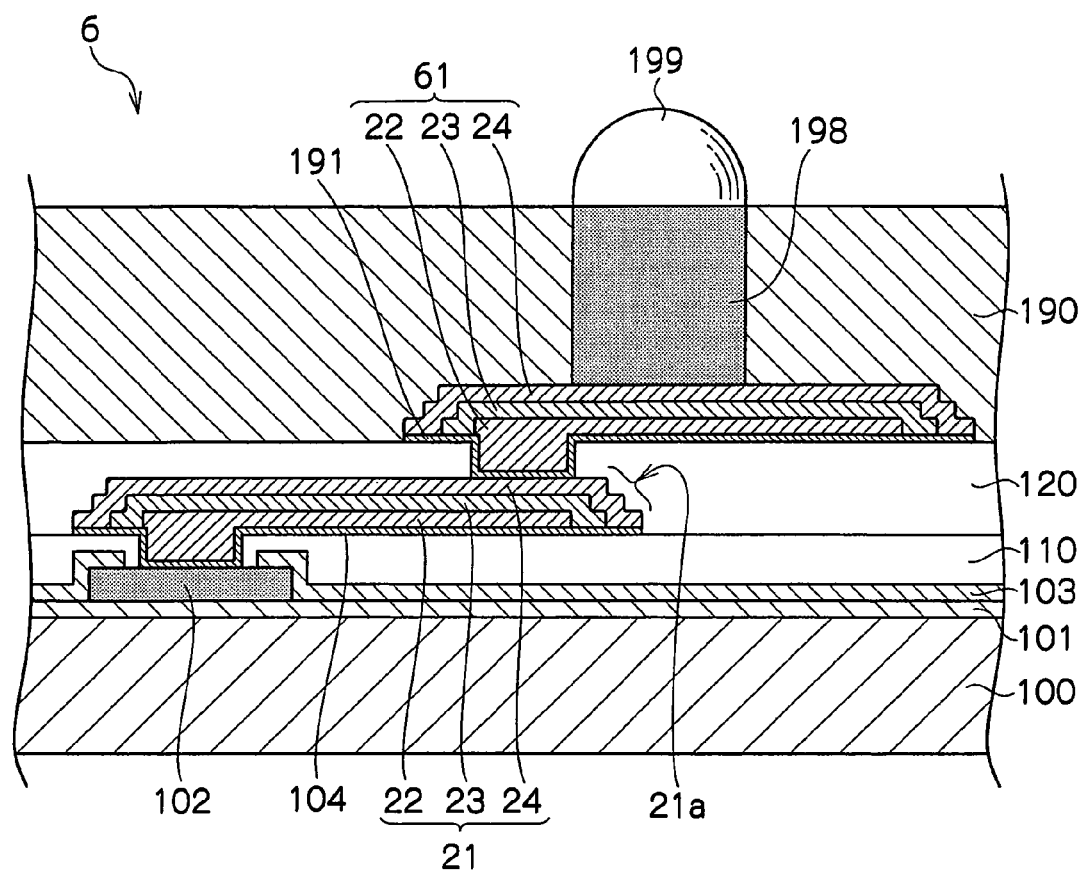
FIG. 11 is a sectional view illustrating the layer structure of a semiconductor device according to the sixth exemplary embodiment of the present invention.

FIG. 11 is a sectional view illustrating the layer structure of a semiconductor device 6 according to the present exemplary embodiment. However, the sectional view as shown in FIG. 11 is a view obtained when the semiconductor device 6 is cut with a plane perpendicular to the surface of the semiconductor substrate 100. In addition, in the present exemplary embodiment, for simplification of the description, a configuration in which the structure according to the present exemplary embodiment is applied to the semiconductor device 2 according to the second exemplary embodiment is described as an example However, the present invention is not limited to this, and to any of the semiconductor devices 1, 3 and 4 as described in the exemplary embodiments 1, 3 and 4, the structure according to the present exemplary embodiment is also applicable.

—Configuration—

As shown in FIG. 11, with the semiconductor device 6 according to the present exemplary embodiment, a second rewiring layer 61 which is formed on the second interlayer insulation film 120, which is the uppermost layer, has the same configuration as that of the first rewiring layer 21 according to the second exemplary embodiment. Because the other configurations are the same as those in the second exemplary embodiment (however, the exemplary embodiments 1, 3 and 4 are not excluded), detailed description thereof is omitted here.

—Fabricating Method—

In addition, the fabricating method for the semiconductor device 6 according to the present exemplary embodiment can be realized by replacing the formation process for the second rewiring layer 192 as described with reference to FIG. 2J in the fabricating method for the semiconductor device 1 as given in the first exemplary embodiment, with the same formation process as the formation process for the first rewiring layer 21 as described with reference to FIG. 5A to FIG. 5C. Therefore, detailed description thereof is omitted herein.

As described hereinabove, the semiconductor device 6 according to the present exemplary embodiment has the same configuration as that of any of the exemplary embodiments 1 to 4. In addition, the fabricating method for the semiconductor device 6 according to the present exemplary embodiment has the same configuration as that of any of the exemplary embodiments 1 to 4. Therefore, the present exemplary embodiment can provide the same effect as that of any of the exemplary embodiments 1 to 4.

In addition, with the semiconductor device 6 according to the present exemplary embodiment, the first interlayer insulation film 120 (the second insulation film) has an aperture 120*a* (a second aperture) for exposing a part of the first rewiring layer (11, 21, 31, or 41). In addition, the semiconductor device 6 according to the present exemplary embodiment has further the second rewiring layer 61 which is formed on the second interlayer insulation film 120 (the second insulation film) and in the inside of the aperture 120*a* (the second aperture), and which uppermost surface has a size smaller than the size of the region surrounded by the outer periphery of the surface contacting with the second interlayer insulation film 120 (the second insulation film), and a sealing resin 190 which is formed on the second rewiring layer 61 and the second interlayer insulation film 120 (the second insulation film).

Further, the fabricating method for the semiconductor device 6 according to the present exemplary embodiment has further the process of forming the aperture 120*a* (the second aperture) for exposing a part of the first rewiring layer (11, 21, 31, or 41) in the second interlayer insulation film 120 (the second insulation film); the process of forming the second rewiring layer 61 which uppermost surface has a size smaller than the size of the region surrounded by the outer periphery of the surface contacting with the second interlayer insulation film 120 (the second insulation film), on the second interlayer insulation film 120 (the second insulation film) and in the inside of the aperture 120*a* (the second aperture); and the process of forming the sealing resin 190 covering the second rewiring layer 61 on the second interlayer insulation film 120 (the second insulation film).

According to this configuration and fabricating method, the semiconductor device 6 according to the present exemplary embodiment can also prevent the problems of interface peeling which occurs in the vicinity of the edge part of the rewiring layer (the second rewiring layer 61) formed on the uppermost layer, between it and the sealing resin 190, and a crack, and the like, which occur in the sealing resin 190, due to the same reason as that for the first rewiring layer (11, 21, 31, or 41).

[Seventh Exemplary Embodiment]

Next, a seventh exemplary embodiment of the present invention will be described in detail with reference to the drawings. In the following description, the same components as those of any of the first exemplary embodiment to the sixth exemplary embodiment will be provided with the same reference numerals and signs, and detailed description thereof is omitted. In addition, the components which are not otherwise described are the same as those of any of the first exemplary embodiment to the sixth exemplary embodiment.

Figure 12:
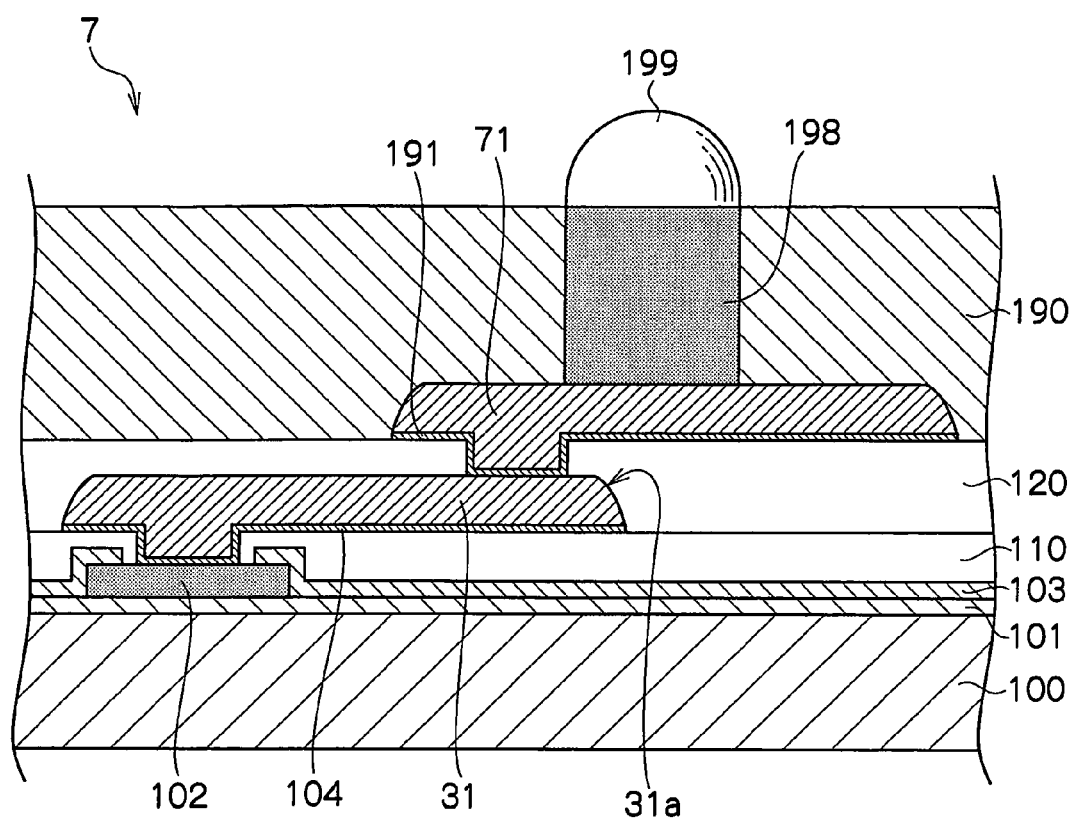
FIG. 12 is a sectional view illustrating the layer structure of a semiconductor device according to a seventh exemplary embodiment of the present invention.

FIG. 12 is a sectional view illustrating the layer structure of a semiconductor device 7 according to the present exemplary embodiment. However, the sectional view as shown in FIG. 12 is a view obtained when the semiconductor device 7 is cut with a plane perpendicular to the surface of the semiconductor substrate 100. In addition, in the present exemplary embodiment, for simplification of the description, a configuration, in which the structure according to the present exemplary embodiment is applied to the semiconductor device 3 according to the third exemplary embodiment, is described as an example. However, the present invention is not limited to this, and to any of the semiconductor devices 1, 2 and 4 as described in the exemplary embodiments 1, 2 and 4, the structure according to the present exemplary embodiment is also applicable.

—Configuration—

As shown in FIG. 12, with the semiconductor device 7 according to the present exemplary embodiment, a second rewiring layer 71 which is formed on the second interlayer insulation film 120, which is the uppermost layer, has the same configuration as that of the first rewiring layer 31 according to the third exemplary embodiment. Because the other configurations are the same as those in the third exemplary embodiment (however, the exemplary embodiments 1, 2 and 4 are not excluded), detailed description thereof is omitted here.

—Fabricating Method—

In addition, the fabricating method for the semiconductor device 7 according to the present exemplary embodiment can be realized by replacing the formation process for the second rewiring layer 192 as described with reference to FIG. 2J in the fabricating method for the semiconductor device 1 as given in the first exemplary embodiment, with the same formation process as the formation process for the first rewiring layer 31 as described with reference to FIG. 7A and FIG. 7B. Therefore, detailed description thereof is omitted herein.

As described hereinabove, the semiconductor device 7 according to the present exemplary embodiment has the same configuration as that of any of the exemplary embodiments 1 to 4. In addition, the fabricating method for the semiconductor device 7 according to the present exemplary embodiment has the same configuration as that of any of the exemplary embodiments 1 to 4. Therefore, the present exemplary embodiment can provide the same effect as that of any of the exemplary embodiments 1 to 4.

In addition, with the semiconductor device 7 according to the present exemplary embodiment, the first interlayer insulation film 120 (the second insulation film) has an aperture 120a (a second aperture) for exposing a part of the first rewiring layer (11, 21, 31, or 41). In addition, the semiconductor device 7 according to the present exemplary embodiment has further the second rewiring layer 71 which is formed on the second interlayer insulation film 120 (the second insulation film) and in the inside of the aperture 120a (the second aperture), and which uppermost surface has a size smaller than the size of the region surrounded by the outer periphery of the surface contacting with the second interlayer insulation film 120 (the second insulation film), and a sealing resin 190 which is formed on the second rewiring layer 71 and the second interlayer insulation film 120 (the second insulation film).

Further, the fabricating method for the semiconductor device 7 according to the present exemplary embodiment has further the process of forming the aperture 120a (the second aperture) for exposing a part of the first rewiring layer (11, 21, 31, or 41) in the second interlayer insulation film 120 (the second insulation film); the process of forming the second rewiring layer 71 which uppermost surface has a size smaller than the size of the region surrounded by the outer periphery of the surface contacting with the second interlayer insulation film 120 (the second insulation film), on the second interlayer insulation film 120 (the second insulation film) and in the inside of the aperture 120a (the second aperture); and the process of forming the sealing resin 190 covering the second rewiring layer 71 on the second interlayer insulation film 120 (the second insulation film).

According to this configuration and fabricating method, the semiconductor device 7 according to the present exemplary embodiment can also prevent the problems of interface peeling which occurs in the vicinity of the edge part of the rewiring layer (the second rewiring layer 71) formed on the uppermost layer, between it and the sealing resin 190, and a crack, and the like, which occur in the sealing resin 190, due to the same reason as that for the first rewiring layer (11, 21, 31, or 41).

[Eighth Exemplary Embodiment]

Next, an eighth exemplary embodiment of the present invention will be described in detail with reference to the drawings. In the following description, the same components as those of any of the first exemplary embodiment to the seventh exemplary embodiment will be provided with the same reference numerals and signs, and detailed description thereof is omitted. In addition, the components which are not otherwise described are the same as those of any of the first exemplary embodiment to the seventh exemplary embodiment.

Figure 13:
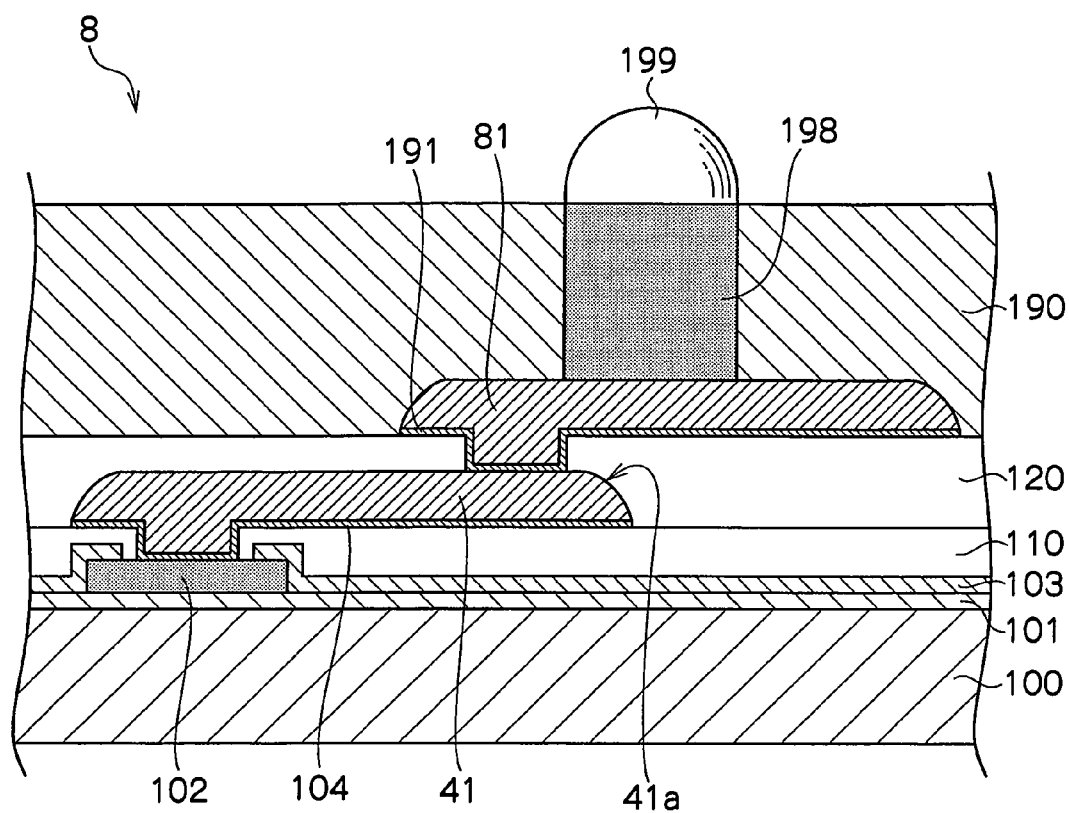
FIG. 13 is a sectional view illustrating the layer structure of a semiconductor device according to an eighth exemplary embodiment of the present invention.

FIG. 13 is a sectional view illustrating the layer structure of a semiconductor device 8 according to the present exemplary embodiment. However, the sectional view as shown in FIG. 13 is a view obtained when the semiconductor device 8 is cut with a plane perpendicular to the surface of the semiconductor substrate 100. In addition, in the present exemplary embodiment, for simplification of the description, a configuration, in which the structure according to the present exemplary embodiment is applied to the semiconductor device 4 according to the fourth exemplary embodiment, is described as an example. However, the present invention is not limited to this, and to any of the semiconductor devices 1 to 3 as described in the exemplary embodiments 1 to 3, the structure according to the present exemplary embodiment is also applicable.

—Configuration—

As shown in FIG. 13, with the semiconductor device 8 according to the present exemplary embodiment, a second rewiring layer 81 which is formed on the second interlayer insulation film 120, which is the uppermost layer, has the same configuration as that of the first rewiring layer 41 according to the fourth exemplary embodiment. Because the other configurations are the same as those in the fourth exemplary embodiment (however, the exemplary embodiments 1 to 3 are not excluded), detailed description thereof is omitted here.

—Fabricating Method—

In addition, the fabricating method for the semiconductor device 8 according to the present exemplary embodiment can be realized by replacing the formation process for the second rewiring layer 192 as described with reference to FIG. 2J in the fabricating method for the semiconductor device 1 as given in the first exemplary embodiment, with the same formation process as the formation process for the first rewiring layer 41 as described with reference to FIG. 9A and FIG. 9B. Therefore, detailed description thereof is omitted herein.

As described hereinabove, the semiconductor device 8 according to the present exemplary embodiment has the same configuration as that of any of the exemplary embodiments 1 to 4. In addition, the fabricating method for the semiconductor device 8 according to the present exemplary embodiment has the same configuration as that of any of the exemplary embodiments 1 to 4. Therefore, the present exemplary embodiment can provide the same effect as that of any of the exemplary embodiments 1 to 4.

In addition, with the semiconductor device 8 according to the present exemplary embodiment, the first interlayer insulation film 120 (the second insulation film) has an aperture 120a (a second aperture) for exposing a part of the first rewiring layer (11, 21, 31, or 41). In addition, the semiconductor device 8 according to the present exemplary embodiment has further the second rewiring layer 81 which is formed on the second interlayer insulation film 120 (the second insulation film) and in the inside of the aperture 120a (the second aperture), and which uppermost surface has a size smaller than the size of the region surrounded by the outer periphery of the surface contacting with the second interlayer insulation film 120 (the second insulation film), and a sealing resin 190 which is formed on the second rewiring layer 81 and the second interlayer insulation film 120 (the second insulation film).

Further, the fabricating method for the semiconductor device 8 according to the present exemplary embodiment has further the process of forming the aperture 120a (the second aperture) for exposing a part of the first rewiring layer (11, 21, 31, or 41) in the second interlayer insulation film 120 (the second insulation film); the process of forming the second rewiring layer 81 which uppermost surface has a size smaller than the size of the region surrounded by the outer periphery of the surface contacting with the second interlayer insulation film 120 (the second insulation film), on the second interlayer insulation film 120 (the second insulation film) and in the inside of the aperture 120a (the second aperture); and the process of forming the sealing resin 190 covering the second rewiring layer 81 on the second interlayer insulation film 120 (the second insulation film).

According to this configuration and fabricating method, the semiconductor device 8 according to the present exemplary embodiment can also prevent the problems of interface peeling which occurs in the vicinity of the edge part of the rewiring layer (the second rewiring layer 81) formed on the uppermost layer, between it and the sealing resin 190, and a crack, and the like, which occur in the sealing resin 190, due to the same reason as that for the first rewiring layer (11, 21, 31, or 41).

In addition, the first exemplary embodiment to the eighth exemplary embodiment as described above provide only examples for embodying the present invention; the present invention is not limited to these; variously modifying these exemplary embodiments is within the scope of the present invention; and further it is obvious from the above statements that, within the scope of the present invention, other various exemplary embodiments are available.

What is claimed is:

1. A semiconductor device, comprising:
   a semiconductor substrate;
   an electrode pad formed on the semiconductor substrate;
   a first insulation film formed on the semiconductor substrate, wherein the first insulation film has a first aperture which exposes the electrode pad;
   a first conductor film formed on the electrode pad and the first insulation film, the first conductor film having a first outer edge portion and a second outer edge portion, wherein the first conductor film extends from the first outer edge portion to the second outer edge portion and comprises a plurality of copper layers which are stacked so that the second outer edge portion of the first conductor film is formed to have a stepped structure;
   an external electrode electrically connected to the first conductor film at a position on the first conductor film that is closer to the second outer edge portion than to the first outer edge portion; and
   a sealing resin which covers the first conductor film and the first insulation film.

2. The semiconductor device according to claim 1, wherein the plurality of copper layers includes an upper copper layer and a lower copper layer, the upper copper layer having an area smaller than that of the lower copper layer.

3. The semiconductor device according to claim 1, wherein the electrode pad includes aluminum.

4. The semiconductor device according to claim 1, further comprising:
   an undercoat metallic film formed between the first insulation film and the first conductor film.

5. The semiconductor device according to claim 4, wherein the undercoat metallic film includes titanium, chromium or tungsten.

6. The semiconductor device according to claim 1, further comprising:
   a second insulation film formed on the first conductor film and the first insulation film, the second insulation film having a contact hole which exposes a part of the first conductor film; and
   a second conductor film formed on the second insulation film and connected to the first conductor film through the contact hole, the second conductor film being electrically connected to the external electrode.

7. The semiconductor device according to claim 1, wherein:
   the plurality of copper layers includes an upper copper layer and a lower copper layer; and
   a side surface of the upper copper layer, a top surface of the lower copper layer and a side surface of the lower copper layer collectively form a shape of a stair step, such that the top surface of the lower copper layer protrudes from the side surface of the upper copper layer outward in a lengthwise direction of the first conductor film.

* * * * *